United States Patent
Li et al.

(10) Patent No.: US 11,275,253 B2
(45) Date of Patent: Mar. 15, 2022

(54) LASER PROJECTOR

(71) Applicant: Hisense Laser Display Co., Ltd., Shandong (CN)

(72) Inventors: Wei Li, Shandong (CN); Youliang Tian, Shandong (CN); Xintuan Tian, Shandong (CN)

(73) Assignee: Hisense Laser Display Co., Ltd., Shandong (CN)

( * ) Notice: Subject to any disclaimer, the term of this patent is extended or adjusted under 35 U.S.C. 154(b) by 223 days.

(21) Appl. No.: 16/689,908

(22) Filed: Nov. 20, 2019

(65) Prior Publication Data
US 2020/0301263 A1 Sep. 24, 2020

Related U.S. Application Data

(63) Continuation of application No. PCT/CN2019/112480, filed on Oct. 22, 2019.

(30) Foreign Application Priority Data

Mar. 20, 2019 (CN) .......................... 201910214208.6
Mar. 20, 2019 (CN) .......................... 201910214780.2
Jun. 20, 2019 (CN) .......................... 201910539489.2

(51) Int. Cl.
*G02B 27/14* (2006.01)
*G03B 21/20* (2006.01)
(Continued)

(52) U.S. Cl.
CPC .......... *G02B 27/143* (2013.01); *G02B 26/06* (2013.01); *G02B 27/0933* (2013.01);
(Continued)

(58) Field of Classification Search
None
See application file for complete search history.

(56) References Cited

U.S. PATENT DOCUMENTS

| 2012/0212711 | A1 | 8/2012 | Goto |
| 2015/0301346 | A1 | 10/2015 | Li et al. |
| 2016/0119595 | A1 | 4/2016 | Lyubarsky et al. |

FOREIGN PATENT DOCUMENTS

| CN | 201576164 U | 9/2010 |
| CN | 102621791 A | 8/2012 |

(Continued)

OTHER PUBLICATIONS

ISA State Intellectual Property Office of the People's Republic of China, International Search Report Issued in Application No. PCT/CN2019/112480, dated Feb. 3, 2020, WIPO, 5 pages.

*Primary Examiner* — Michelle M Iacoletti
*Assistant Examiner* — Danell L Owens
(74) *Attorney, Agent, or Firm* — Hauptman Ham, LLP

(57) ABSTRACT

A laser projector includes a laser assembly, a beam combination mirror group and a phase delaying component. The laser assembly includes a red laser light emitting region, a blue laser light emitting region and a green laser light emitting region. Red laser light is polarized in a first direction, green laser light is polarized in a second direction, and blue laser light is polarized in a third direction. The beam combination mirror group combines the red laser light, the blue laser light and the green laser light. The phase delaying component is on a light emitting path of at least one of the red laser light, the blue laser light the green laser light, and changes a polarization direction of the at least one of the red laser light, the blue laser light or the green laser light before being output by the beam combination mirror group.

19 Claims, 20 Drawing Sheets

(51) Int. Cl.
  *H01S 5/40* (2006.01)
  *G02B 26/06* (2006.01)
  *G03B 21/00* (2006.01)
  *G02B 27/09* (2006.01)
  *H01S 5/00* (2006.01)

(52) U.S. Cl.
  CPC ......... *G02B 27/0938* (2013.01); *G02B 27/14* (2013.01); *G03B 21/008* (2013.01); *G03B 21/208* (2013.01); *G03B 21/2013* (2013.01); *G03B 21/2033* (2013.01); *G03B 21/2073* (2013.01); *H01S 5/4012* (2013.01); *H01S 5/4093* (2013.01); *H01S 5/005* (2013.01)

(56) References Cited

FOREIGN PATENT DOCUMENTS

| | | | |
|---|---|---|---|
| CN | 102645831 A | | 8/2012 |
| CN | 102985869 B | | 2/2015 |
| CN | 106707668 A | | 5/2017 |
| CN | 208092417 U | | 11/2018 |
| JP | 2017015955 A | * | 1/2017 |

* cited by examiner

LASER PROJECTOR

CROSS-REFERENCE TO RELATED APPLICATIONS

This patent application is a continuation of International Application No. PCT/CN2019/112480, filed on Oct. 22, 2019, which claims the priorities of the Chinese patent application No. 201910214208.6 filed on Mar. 20, 2019, the Chinese patent application No. 201910214780.2 filed on Mar. 20, 2019 and the Chinese patent application No. 201910539489.2 filed on Jun. 20, 2019, the contents of which are incorporated herein by reference in their entireties.

TECHNICAL FIELD

The present application relates to the field of laser projection display technology, and in particular, to a laser projector.

BACKGROUND

The laser light source has the advantages of good monochromaticity, high brightness and long service life, and is an ideal light source. As the power of lasers increases to meet the certain requirements of industrial application, lasers are increasingly being used as illumination light sources. For example, in recent years, lasers have been used in projectors to replace mercury lamps as projection light sources. In addition, lasers have the advantages of small optical expansion and high brightness as compared to Light Emitting Diode (LED) light sources.

Lasers may be classified into blue lasers, red lasers and green lasers according to the type of illumination, which emit blue, red and green laser light, respectively. The blue laser is first applied industrially, and the red and green lasers are limited by power, for example, if the emission power is less than 1 W, the brightness will be low, so that they could not have been applied for a long time. Therefore, most of laser projection light sources appearing in the industry are hybrid laser light sources of monochromatic laser light (blue laser light) and fluorescent light excited by the blue laser light.

Laser light emitted by the lasers is linearly polarized light. The blue and green laser light is generated by using a gallium arsenide luminescent material, and the red laser light is generated by using a gallium nitride luminescent material. Due to different luminescent mechanisms of different luminescent materials, resonant cavities are oscillated in different directions during the light emission of the red, blue and green laser light. Specifically, the polarization direction of red laser linearly polarized light differs from that of blue laser linearly polarized light and green laser linearly polarized light in 90 degrees. In addition, the red laser light is P-polarized light, and the blue and green laser light is S-polarized light.

When applying three-color laser for projection imaging, the picture on projection screen media has a local color aberration phenomenon such as "color speckle" or "color patch", which greatly affects the viewing experience.

There is a need for a solution to solve the problem of the poor quality of the projected image caused by the above-mentioned color aberration phenomenon.

SUMMARY

The present application provides a laser projector capable of solving the problem of the local color aberration phenomenon present on a three-color laser projection image in the prior art.

In an aspect, the present application provides a laser projector, including a laser assembly comprising a red laser light emitting region configured to output a red laser light, a blue laser light emitting region configured to output a blue laser light, and a green laser light emitting region configured to output a green laser light, where red laser light is polarized in a first direction, the green laser light is polarized in a second direction, the blue laser light is polarized in a third direction, and the first direction is different from at least one of the second direction or the third direction; a beam combination mirror group configured to combine the red laser light, the blue laser light and the green laser light emitted by the laser assembly; a phase delaying component, on a light emitting path of at least one of the red laser light, the blue laser light or the green laser light, and configured to change a polarization direction of the at least one of the red laser light, the blue laser light or the green laser light before the red laser light, the green laser light, and the blue laser light are output by the beam combination mirror group.

In another aspect, the present application also provides a laser projector, including a laser assembly configured to emit red laser light, blue laser light, and green laser light, where red laser light is polarized in a first direction, the green laser light is polarized in a second direction, the blue laser light is polarized in a third direction, and the first direction is different from at least one of the second direction or the third direction; a beam combination mirror group on an optical output path of the red laser light, the blue laser light and the green laser light, the beam combination mirror group being configured to combine the red laser light, the blue laser light, and the green laser light to generate a combined beam; a beam shaping component configured to receive the combined beam emitted by the beam combination mirror group and contract the combined beam; a diffusion wheel configured to rotate and diffuse the combined beam contracted by the beam shaping component; an optical homogenizing component configured to homogenize the combined beam diffused by the diffusion wheel; a light valve configured to receive a driving signal, modulating the combined beam homogenized by the optical homogenizing component, and output the modulated combined beam to a projection lens; and a phase delaying component on an optical path before the modulated combined beam is output to the projection lens and configured to change a polarization direction of at least one of the red laser light, the green laser light and the blue laser light.

BRIEF DESCRIPTION OF THE DRAWINGS

FIG. 5A-1 is a schematic view illustrating a structure of a laser projector according to one or more embodiments.

FIG. 5A-2 is a schematic view illustrating a structure of a light source unit in FIG. 5A-1;

FIG. 5A-3 is a schematic view illustrating a cross-sectional structure of the light source unit in FIG. 5A-2 in accordance with one or more embodiments.

FIG. 6A-1 is a schematic view illustrating a structure of a half-wave plate according to one or more embodiments.

FIG. 6A-2 is a schematic view illustrating the principle of a change in a polarization direction by 90 degree according to one or more embodiments.

FIG. 6A-3 is a schematic view illustrating polarization directions of P-polarized light and S-polarized light according to one or more embodiments.

FIG. 6A-4 is a schematic view illustrating a rotation configuration of a wave plate according to one or more embodiments.

FIG. 12B-1 is a schematic view illustrating a cross-sectional structure of a light source unit shown in FIG. 5B-1;

FIG. 12B-2 is a schematic view illustrating a plane structure of a diffusion wheel according to one or more embodiments.

DETAILED DESCRIPTION

Figure 1:
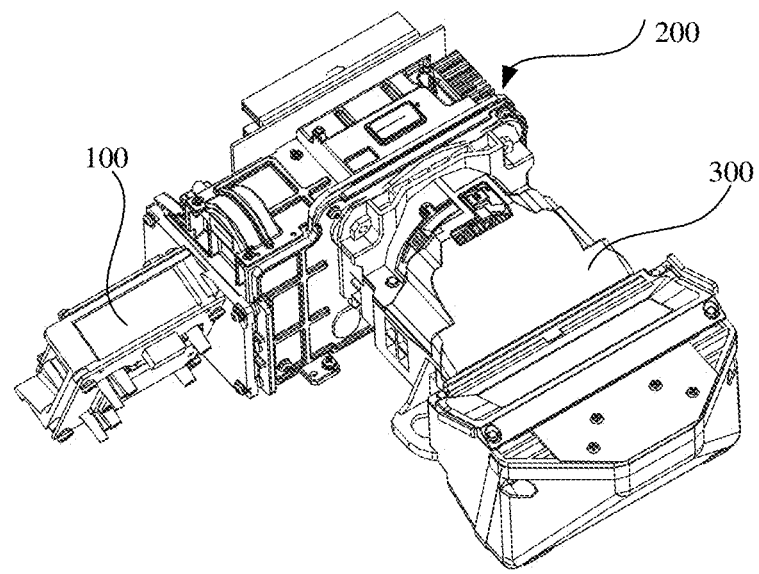
FIG. 1 is a schematic view illustrating a structure of a laser projector according to one or more embodiments.

FIG. 1 is a schematic view illustrating a structure of a laser projector. According to the function of an optical system, the laser projector includes a light source unit 100, a lighting system 200, and a lens unit 300. The light source unit 100 and the lighting system 200 may also be referred to as an optical engine.

The lighting system 200 contains an optical modulator which is a core component of the system. The optical modulator, also known as a light valve, may be transmissive Liquid Crystal Display (LCD), Liquid Crystal on Silicon (LCOS), or Digital Micro-mirror Devices (DMD) chip. The DMD chip is applied to a Digital Light Processing (DLP) projection architecture.

Figure 2A:
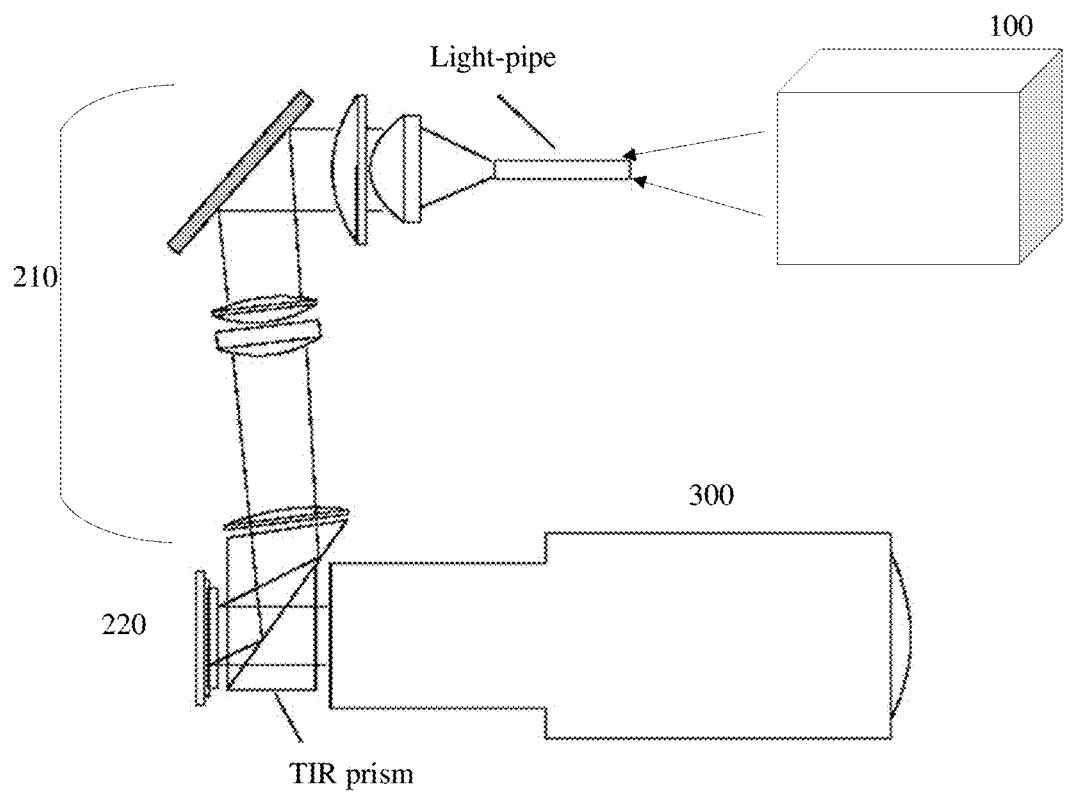
FIG. 2A is a schematic view illustrating a DLP projection architecture according to one or more embodiments.

FIG. 2A illustrates a DLP projection architecture, in which the DMD chip is a core component of the overall projection architecture. The following is an example of the application of a monolithic DMD chip. A DMD chip 220 is a reflective light valve component. After passing through an illumination optical path 210 in front of the DMD chip 220, an illumination beam output by the light source unit 100 conforms to an illumination size and incidence angle of the DMD chip 220. A surface of the DMD chip 220 may include thousands of micro-mirrors, each of which may be individually driven to deflect. For example, the DMD chip provided by TI (Texas Instruments) may be deflected by plus or minus 12 or 17 degrees. Light reflected by a positive deflection angle is called ON light, and light reflected by a negative deflection angle is called OFF light. The OFF light is invalid light and usually hits onto a housing or absorbed by a provided optical absorption device. The ON light is valid light incident into the lens unit 300 and will be used for projection imaging.

The lens unit 300 includes a plurality of lens combinations, which may generally be divided into groups. For example, the lens unit 300 may be divided into a front group, a middle group, and a rear group, or into a front group and a rear group. The front group is a group of lenses near a light emitting side of the projector, and the rear group is a group of lenses near a light emitting side of the optical modulator. In the ultra-short-throw projection, the lens unit 300 is an ultra-short-throw projection lens whose throw ratio is usually less than 0.3. The ultra-short-throw projection lens shown in FIG. 3A includes a refractive lens group 310 and a reflective lens group 320. The reflective lens group 320 may be provided as a curved reflector such that projection beams are obliquely projected upward onto a projection screen 400 for imaging after passing through the lens unit 300 as shown in FIG. 3B. In other words, unlike the conventional light emitting way in which the optical axis of projection beams in telephoto projection is located on the vertical line in a projected image, the ultra-short-throw projection lens may usually have an offset of 120% to 150% with respect to the projected image.

Because the DMD chip has a small size, for example, the DMD chip currently provided by TI has a size of 0.66 inches or 0.47 inches, and the projected image usually has a size of above 70 inches such as between 80 inches and 150 inches, the lens unit 300 achieves magnification by hundred times and correct aberration to have a good resolution, thereby presenting a high-definition projected image. The design of the ultra-short-throw projection lens is much more difficult than that of the telephoto projection lens.

In the ultra-short-throw projector, the vertical line of a light exiting surface of the DMD chip 220 is parallel to but does not overlap the optical axis of the lens unit 300. In other words, by biasing the DMD chip 220 to the lens unit 300, the beam emitted from the light exiting surface of the DMD chip 220 is obliquely incident into the lens unit 300 at an angle, and finally emits out obliquely upward from the lens unit 300 after being transmitted and reflected by a partial region of a plurality of lenses.

DMD chip, as an optical modulator, is driven by an electric signal to modulate a beam such that the modulated beam carries image information and is finally enlarged by the lens unit 300 to form a projected image.

Figure 3A:
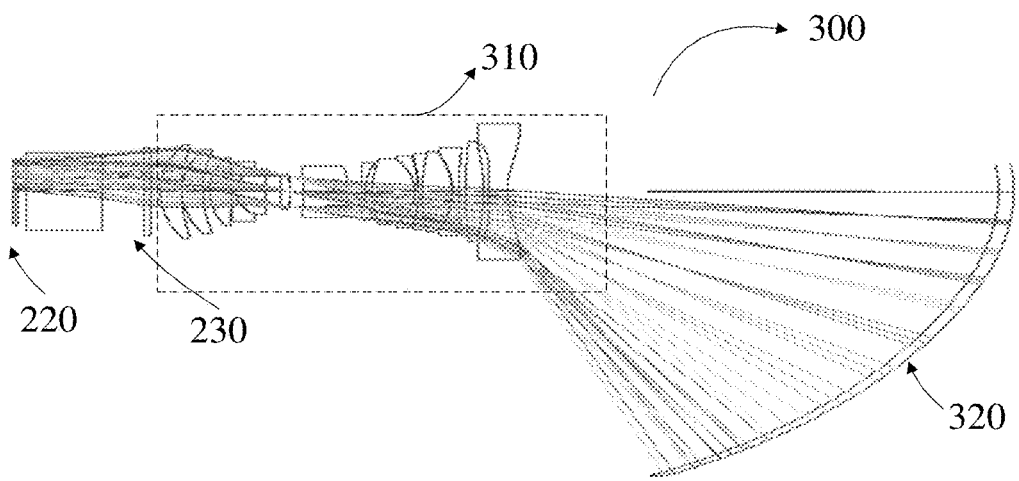
FIG. 3A is a schematic view illustrating an ultra-short-throw projection imaging optical path according to one or more embodiments.
Figure 3B:
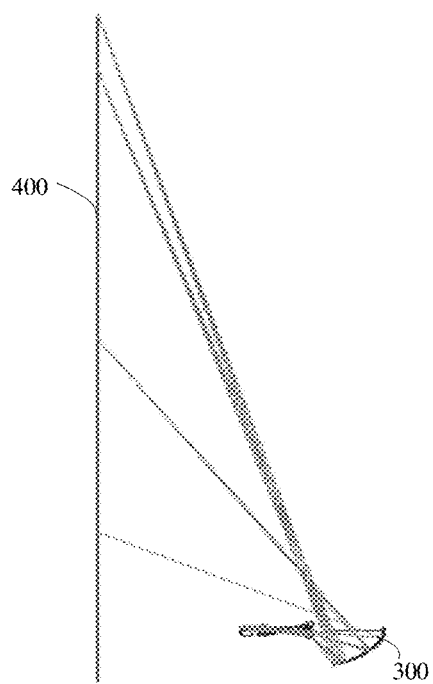
FIG. 3B is a schematic view illustrating an ultra-short-throw projection system according to one or more embodiments.

On the basis of the relatively fixed resolution of the DMD chip itself, in order to realize an image screen with higher definition and resolution, as shown in FIG. 3A, a vibrating mirror 230 may be disposed in an optical path of light emitted from the DMD chip to a lens. The vibrating mirror 230 may be of a transmissive flat plate structure. By one-dimensional vibration, the vibrating mirror 230 angularly shifts the image beams that are successively transmitted there-through, so that the beams of two adjacent images are imaged on the projection screen after being overlaid in a staggered way. In this way, by using the vision persistence effect of human eyes, the information of the two images is overlaid into the information of one image, so that image details perceived by the human eyes are increased, which may be equivalent to an improvement on image resolution.

The vibrating mirror 230 may also perform two-dimensional movement, for example, move in four positions of up, down, left and right to overlay the four images together in a staggered way, thereby improving the resolution perceived by human eyes with the principle of overlapping the information as described above.

Whether two or four images are overlaid, the images for overlapping need to be decomposed by a high-resolution image in advance, and the decomposition method needs to match the movement mode of the vibrating mirror so as to be correctly overlaid without image confusion.

The vibrating mirror 230 is typically disposed between the DMD chip 220 and the lens unit 300. Beams traveling between the DMD chip 220 and the lens unit 300 may be approximated as parallel beams, and the parallel beams may still maintain a good parallelism after being refracted by the vibrating mirror 230. However, a beam having a large divergence angle, after being refracted by the vibrating mirror 230, changes greatly in angles, which may cause unevenness in brightness or chromaticity when the two image beams successively passing through the vibrating mirror 230 are overlaid.

Figure 2B:
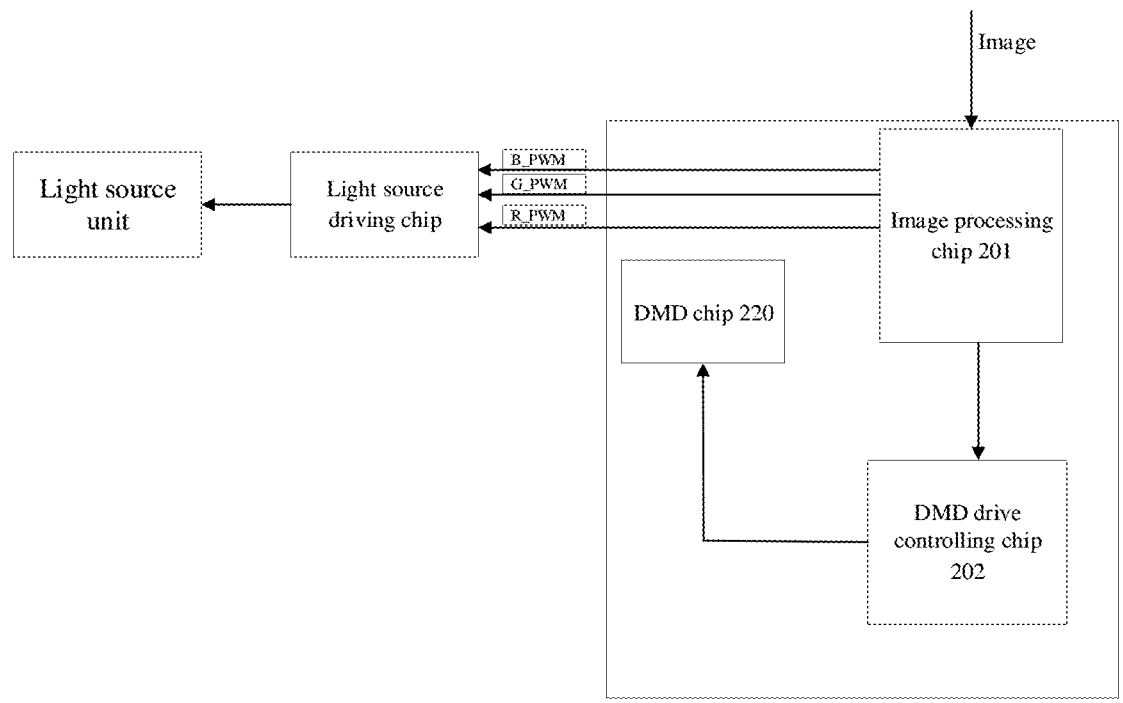
FIG. 2B is a schematic view illustrating a circuit architecture of a DLP projection system according to one or more embodiments.

FIG. 2B is a schematic view illustrating a circuit architecture of a DLP projection system. As shown in FIG. 2B, the DLP projection system may include an image processing chip 201, a DMD chip 220, and a DMD drive controlling chip 202. The image processing chip 201 decomposes an image to be displayed into RGB three-color component images, and outputs a signal of each component image (R or G or B component image) to the DMD drive controlling chip 202. In this way, the DMD drive controlling chip 202 may convert the signal of the component image into a driving signal of the DMD chip 220 to drive the micro-mirrors of the DMD chip 220 for deflection, and form the brightness of a certain primary color component image by the angle and the duration of the deflection of the micro-mirrors. After overlapping of multi-primary color component image frames, a color image is formed using the vision persistence effect of human eyes. It should be noted that, in the above circuit architecture, the DMD drive controlling chip 202 may also be integrated with the DMD chip 220.

Since the driving signals received by the DMD chip 220 are generated respectively based on the RGB three primary color components of the image to be displayed, that is, when the DMD chip 220 receives a driving signal corresponding to the R primary color component, red light should be received. Similarly, when the DMD chip 220 receives a driving signal corresponding to a G or B primary color component, green or blue light should be received. Therefore, the projection light source needs to cooperate with the DLP system to synchronously output the projection beam of the color that should be received by the DMD chip 220.

Therefore, in the example above, the light source unit 100 is configured to supply the lighting system 200 with an illumination light source. Specifically, the light source unit 100 supplies the lighting system 200 with an illumination beam by chronologically outputting three primary color illumination beams in synchronization.

The light source unit 100 may also provide a non-chronological output. For example, when other types of optical modulators are applied, in order to cooperate with a three-panel LCD light valve, light of three primary colors in the light source unit 100 may be simultaneously illuminated to output mixed white light. In the example above, the light source unit 100 outputs the light of three primary colors chronologically. However, according to the principle of three-color light mixture, human eyes may not recognize the color of light at a certain moment, and what is perceived is still the mixed white light. Therefore, the output of the light source unit 100 is also generally referred to as mixed white light.

Figure 4A:
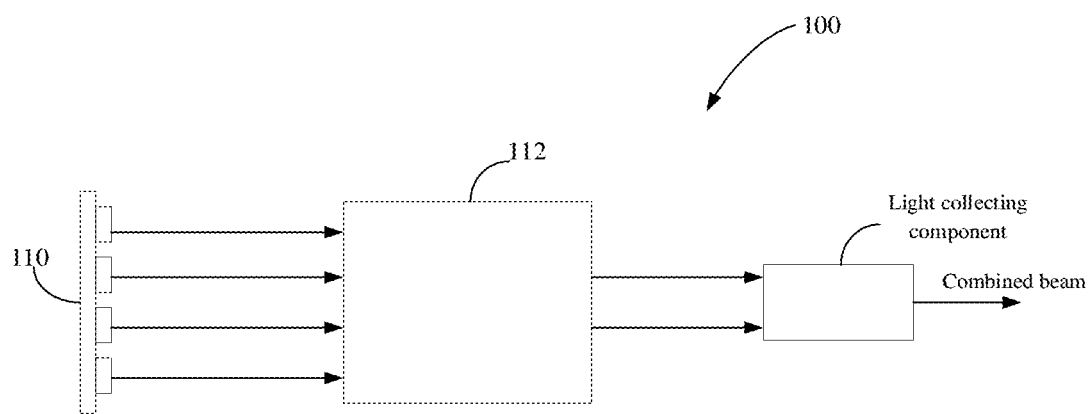
FIG. 4A is a schematic view illustrating an optical structure of a light source unit according to one or more embodiments.

As shown in FIG. 4A, the light source unit 100 includes a laser assembly 110 and a beam shaping component 112. Beam shaping may include processes such as combining, homogenizing, and contracting light, etc. This is because, on one hand, the optical modulator has size and angle specifications for the reception of light spot, and on the other hand, the luminous efficiency, uniformity, coherence and other index in an optical path system are also considered to ensure that the light source unit 100 may be configured to provide high-quality illumination beam.

Figure 4B:
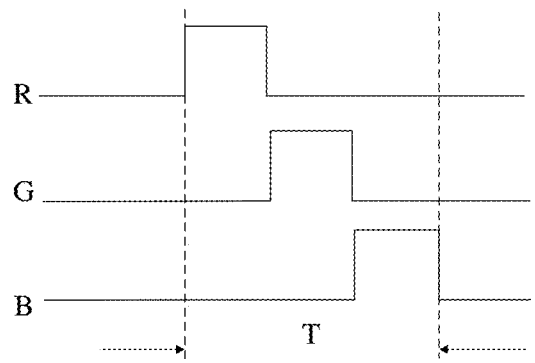
FIG. 4B is a schematic view illustrating output timing of a light source unit according to one or more embodiments.

In one example, the light source unit 100 emits laser beams of three colors. The laser assembly 110 may be an independent laser assembly of RGB three colors, or a package assembly including light emitting chips of three colors. The light source unit 100 emits laser light of RGB three primary colors in turn chronologically in accordance with the synchronization control signals output from the DLP system. The timing diagram may be seen in FIG. 4B.

It should be noted that in order to enhance the brightness of the light source, it is sometimes possible to add yellow light on the basis of the three-primary-color laser light. For example, yellow light may be produced by overlapping red and green light. In other words, based on FIG. 4B, there may be a period in which two-primary-color light is simultaneously output.

When applying the above-mentioned ultra-short-throw laser projector to projection imaging, an ultra-short-throw projection screen is often matched with high gain and contrast to better restore a high-brightness and high-contrast projected image.

Figure 4C:
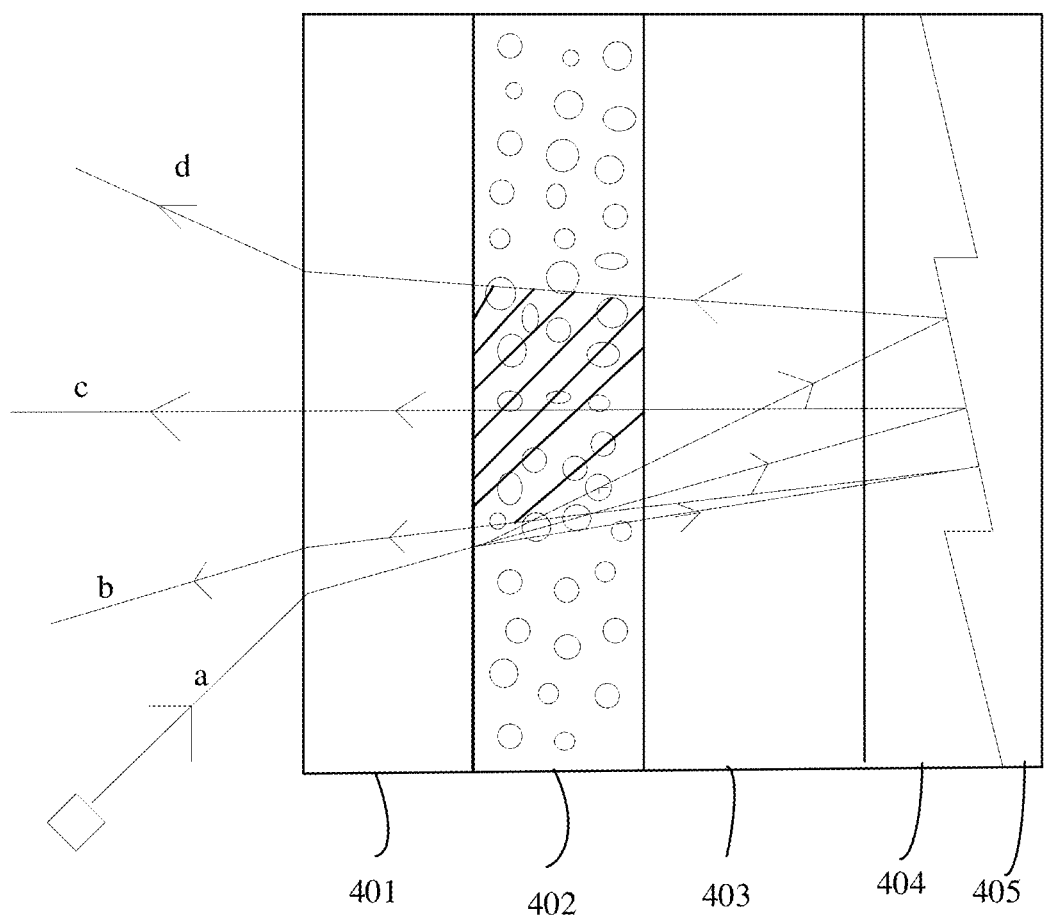
FIG. 4C is a schematic view illustrating a structure of an ultra-short-throw projection screen according to one or more embodiments.

An ultra-short-throw projection screen, as shown in FIG. 4C, is a Fresnel optical screen 400. The Fresnel optical screen 400 includes a substrate layer 401, a diffusion layer 402, a uniform medium layer 403, a Fresnel lens layer 404, and a reflective layer 405 along the incident direction of projection beams. The Fresnel optical screen 400 typically has a thickness between 1 and 2 mm, with the substrate layer 401 occupying the largest proportion of thickness. The substrate layer 401 also serves as a support layer structure for the entire Fresnel optical screen 400, and has a certain light transmittance and hardness. Projection beams are first transmitted through the substrate layer 401, then into the diffusion layer 402 for diffusion, and into the uniform medium layer 403. The uniform medium layer 403 is a uniform medium to allow beams to pass through, and may be made of the same material as the substrate layer 401, for example. After the beams are transmitted through the uniform medium layer 403, they are incident into the Fresnel lens layer 404. The Fresnel lens layer 404 concentrates and collimates the beams, and the reflective layer 405 reflects the collimated beams. Then the collimated beams are folded back from the reflective layer 405 to sequentially pass through the Fresnel lens layer 404, the uniform medium layer 403, the diffusion layer 402, and the substrate layer 401 and are incident into user's eyes.

Figure 4D:
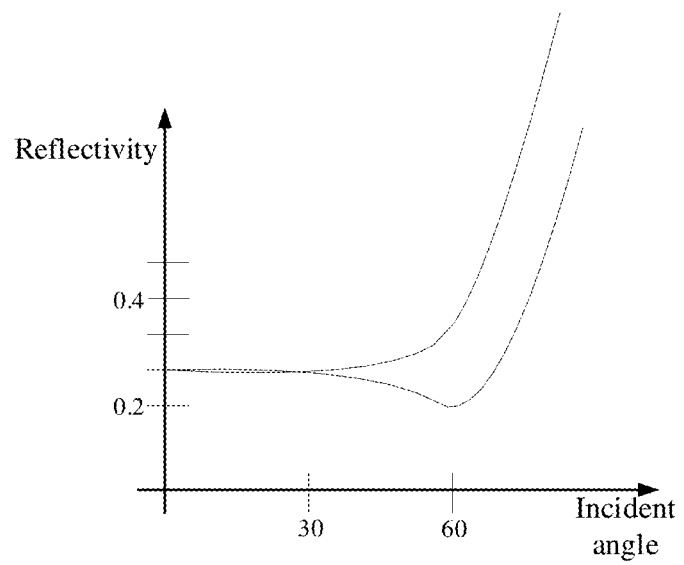
FIG. 4D is a graph illustrating a change in reflectivity of the projection screen in FIG. 4C to projection beams, in accordance with one or more embodiments.

In the process of research, the applicant found that local color aberration phenomenon will be present on the ultra-short-throw projected image of three-color laser light source, resulting in uneven chromaticity such as "color speckle" and "color patch". One reason for this phenomenon is that, on one hand, in the currently applied three-color laser, the polarization directions of laser beams of different colors are different. For example, a plurality of optical lenses, such as lenses and prisms, are usually provided in an optical system, and the optical lens itself has a difference in transmittance and reflectivity (hereinafter also referred to as transflectivity) of P-polarized light and S-polarized light. For example, an optical lens has a transmittance for P-polarized light greater than that for S-polarized light. On the other hand, due to the material and structure of the screen, with the change of incidence angle of the ultra-short-throw projection beam, the ultra-short-throw projection screen will present a significant change in transmittance and reflectivity of beams in different polarization directions. For example, as shown in FIG. 4D, for a red projection beam, when the projection angle is about 60 degrees, the reflectivity of the projection screen to the red projection beam which is P-polarized light differs from that to the red projection beam which is S-polarized light by more than 10 percentage points through tests. The ultra-short-throw projection screen has a higher reflectivity to P-polarized red light than to S-polarized red light, which causes more P-polarized red light but less S-polarized red light to be reflected into the human eyes by the screen. Such phenomenon that the projection screen has a difference in transmittance and reflectivity of red light in different polarization directions also exists with respect to other color light in projection beams. When the light of the three primary colors is in different polarization states, after passing through the projection optical system and the projection screen, the obvious difference in transmittance and reflectivity of the projection screen to light in different polarization states may cause light of different colors reflected into the human eyes by the screen to have unbalanced luminous flux, eventually leading to presence of local color aberration phenomenon on the projected image, which is especially noticeable when a color picture is presented.

In order to solve the above-described problems, the present application proposes the following exemplary solutions.

Figures 1, 5A:
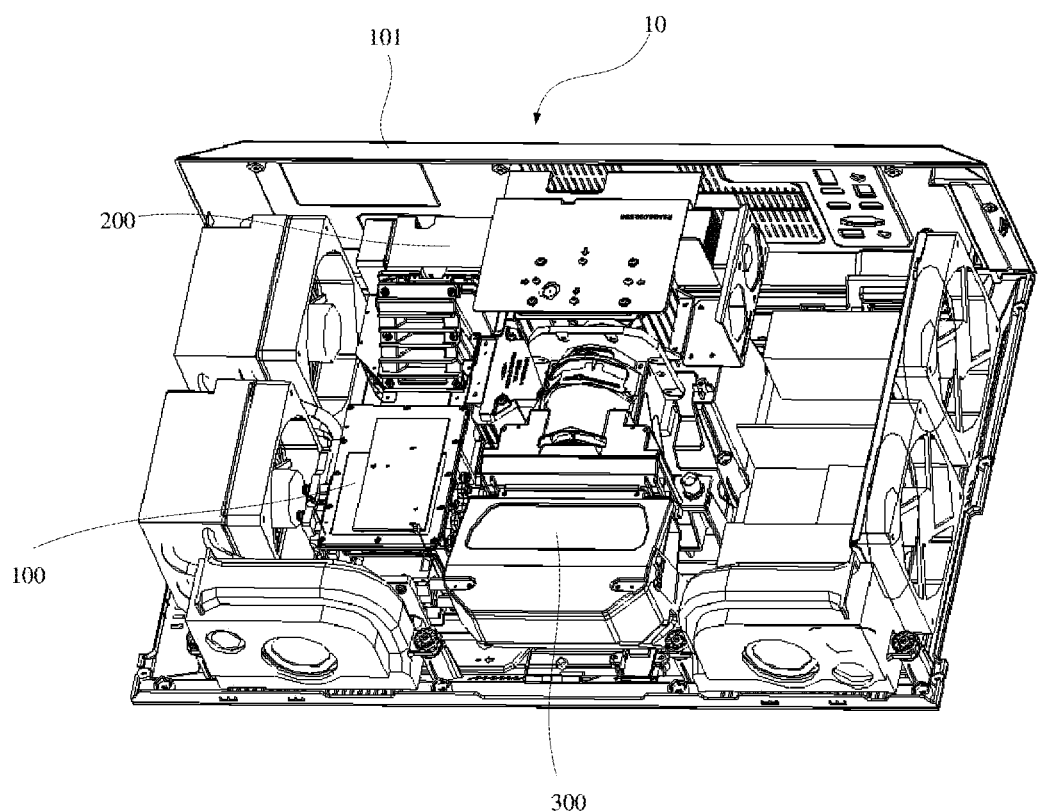

FIG. 5A-1 is a diagram of a laser projector 10, in accordance with one or more embodiments. The laser projector 10 includes a housing 101 and a projection imaging system wrapped by the housing 101. The projection imaging system includes a light source unit 100, a lighting system 200, and a lens unit 300. The light source unit 100 emits laser beams of three colors.

Figures 2, 5A:
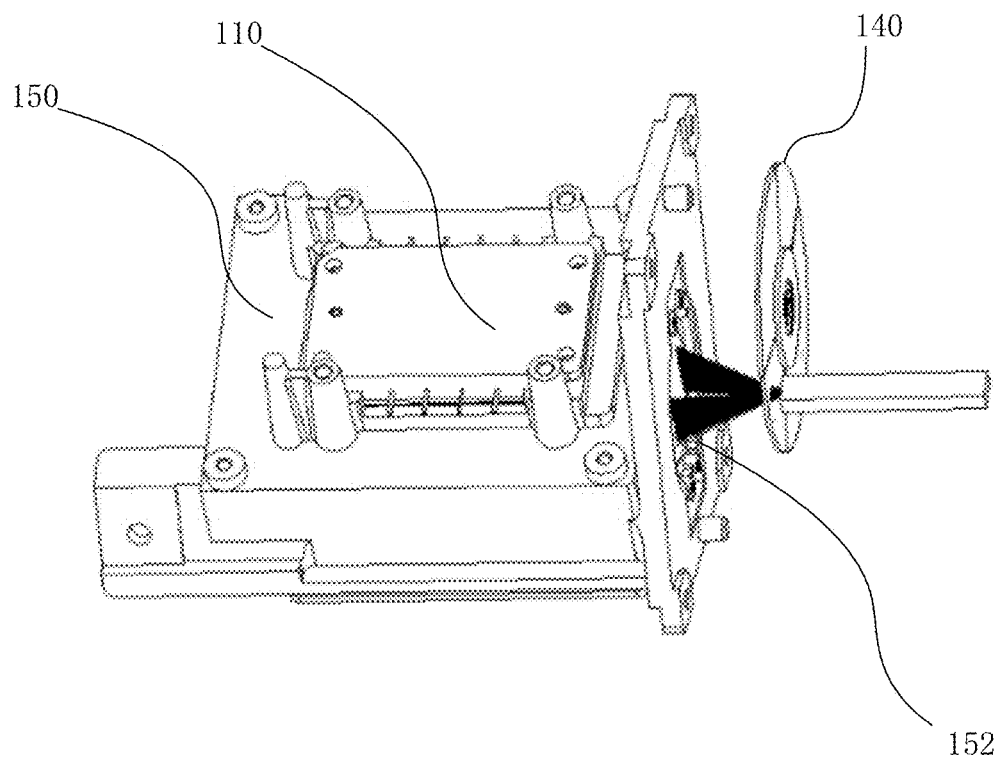

As shown in FIG. 5A-2, it is an example of the light source unit 100 in the laser projector 10. The light source unit 100 includes a housing 150 and a laser assembly 110. The light source unit 100 is a laser light source of three colors. The three-color laser beams are emitted from an opening 152 of the light source unit 100, and are incident into a diffusion unit 140 which is, for example, a diffusion wheel.

Figures 3, 5A:
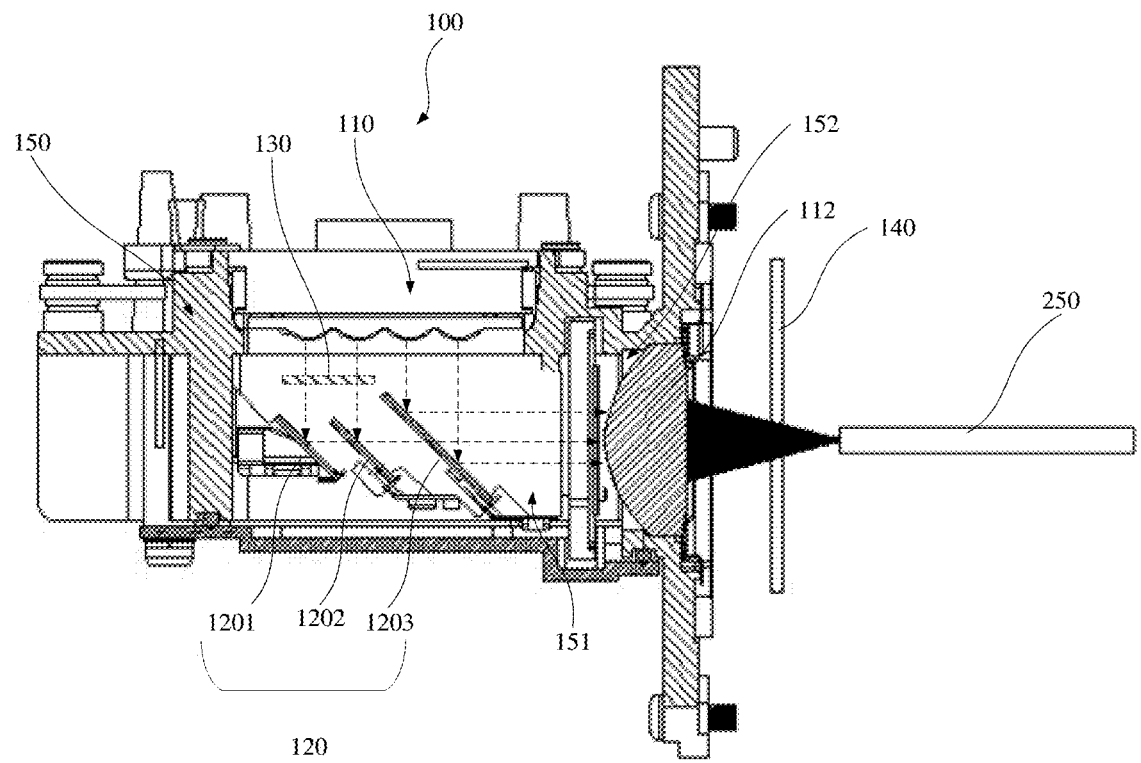

FIG. 5A-3 is an exemplary cross-sectional structural view of FIG. 5A-2. The housing 150 has a receiving cavity 151. The laser assembly 110 and a beam combination mirror group 120 are at least partially housed in the receiving cavity 151. The receiving cavity 151 has the opening 152 along a light emitting direction of the light source.

Figure 5B:
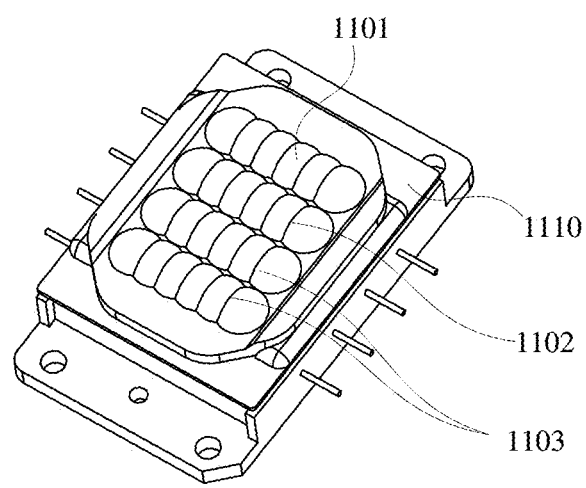
FIG. 5B is a schematic view illustrating a structure of a laser assembly in FIG. 5A according to one or more embodiments.

FIG. 5B is a schematic view illustrating a structure of a laser assembly in FIG. 5A. As shown in FIG. 5B, the laser assembly includes a red laser light emitting region 1103, a blue laser light emitting region 1102, and a green laser light emitting region 1101. Specifically, laser light emitting chips of three colors are arranged in a matrix and packaged in a module. For example, an MCL (mean control limit) laser used in one example is in a 4×5 light emitting array. The laser assembly includes a substrate 1110. The substrate 1110 is packaged with a plurality of light emitting chips, and a collimating lens group may be disposed at a light emitting surface of the laser assembly. The light emitting surface of the laser assembly has a plurality of light emitting regions, and beams emitted by different light emitting regions have different colors. For example, green light is emitted from a row, blue light is emitted from another row, and red light is emitted from the remaining two rows. The above laser assembly packages the three-color light emitting chips together, and has a small volume, which is advantageous for reducing the volume of a light source unit 100. The red laser light emitted by the laser assembly is P-polarized light, and the green and blue laser light emitted thereby are both S-polarized light.

It should be noted, the laser assembly is not limited to be arranged in the above-mentioned 4×5 array, which may be arranged in other array, such as a 3×5 array or a 2×7 array, as long as laser beams of three colors can be emitted.

Figure 5C:
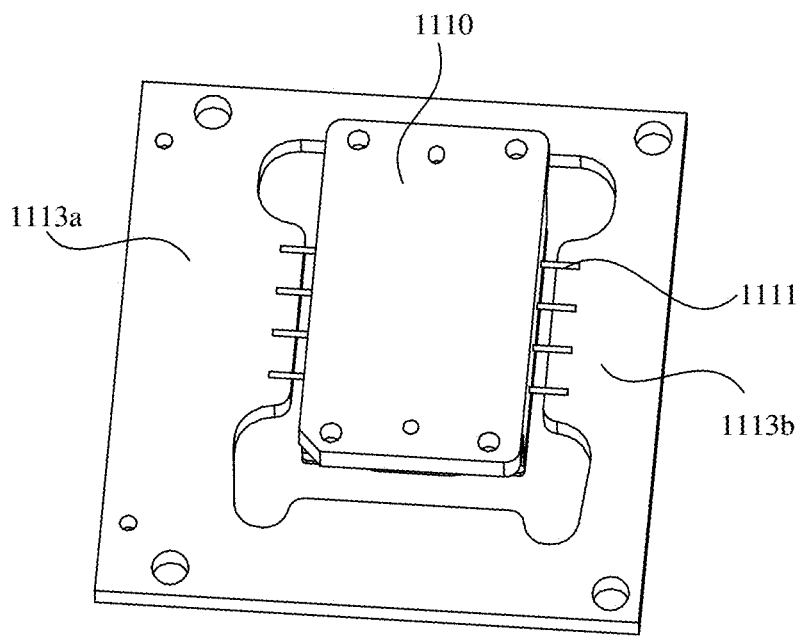
FIG. 5C is a schematic view illustrating a package structure of the laser assembly in FIG. 5A according to one or more embodiments.

In the laser assembly 110, a circuit board parallel to a light emitting surface of a laser is surrounded on the outside of the laser to provide a drive control signal for the laser. Moreover, as shown in FIG. 5C, the circuit board has a flat plate structure, and the laser has pins 1111 on both sides. The pins 1111 are respectively soldered or plugged onto circuit boards 1113a and 1113b which are almost parallel to a plane where the laser is. The circuit boards 1113a and 1113b may be integrally formed and surround the outside of the substrate 1110 of the laser assembly. Alternatively, the circuit boards 1113a and 1113b may also be two separate circuit boards that enclose the laser assembly 110. In this way, the packaged laser assembly may also be regarded as a flat plate structure, which is easy to install and saves space and is also advantageous for miniaturization of the light source unit 100.

As shown in FIGS. 5A-2 and 5A-3, the laser assembly 110 may be fixed to the housing 150 by screws, and will emits laser beams of three colors into the receiving cavity 151 inside the housing 150. Further, a phase delaying component 130 and the beam combination mirror group 120 are disposed within the receiving cavity 151 inside the housing 150 toward the light emitting surface of the laser assembly.

A plurality of beam combination mirrors are disposed for the light emitting region of each color of the laser assembly 110. The plurality of beam combination mirrors forms the beam combination mirror group 120 for combining laser beams from different light emitting regions.

In some embodiments, the blue laser light emitting region 1102 and the green laser light emitting region 1101 are disposed adjacent to each other, and the phase delaying component 130 is disposed toward the beams of the blue laser light emitting region 1102 and the green laser light emitting region 1101, and is located on an output path of blue light and green light and in front of the beam combination mirror group 120.

Figures 1, 6A:
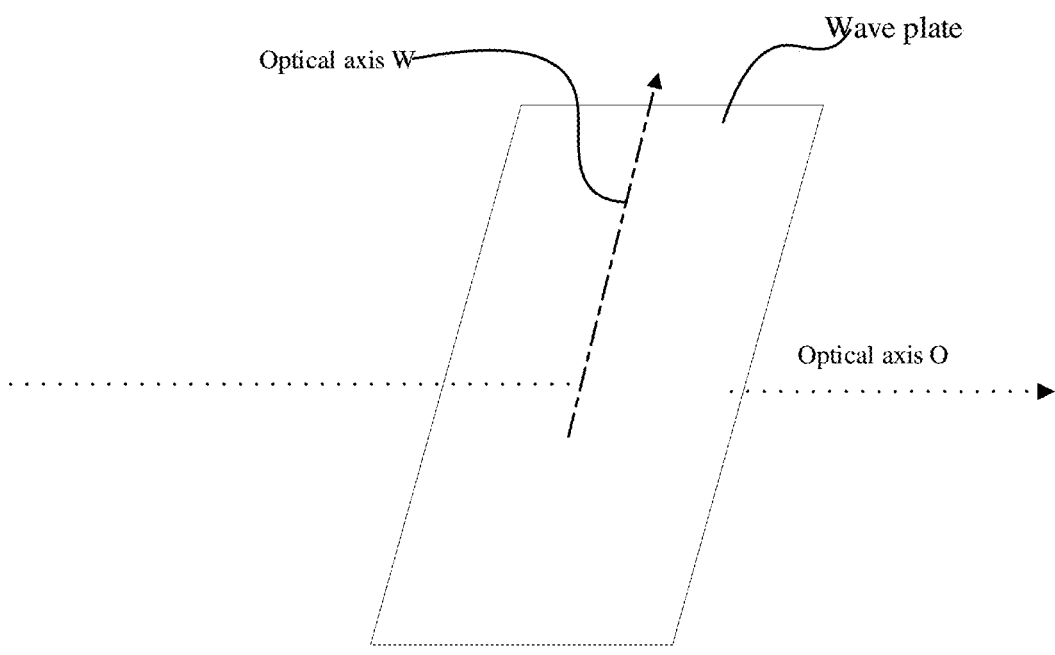
Figures 2, 6A:
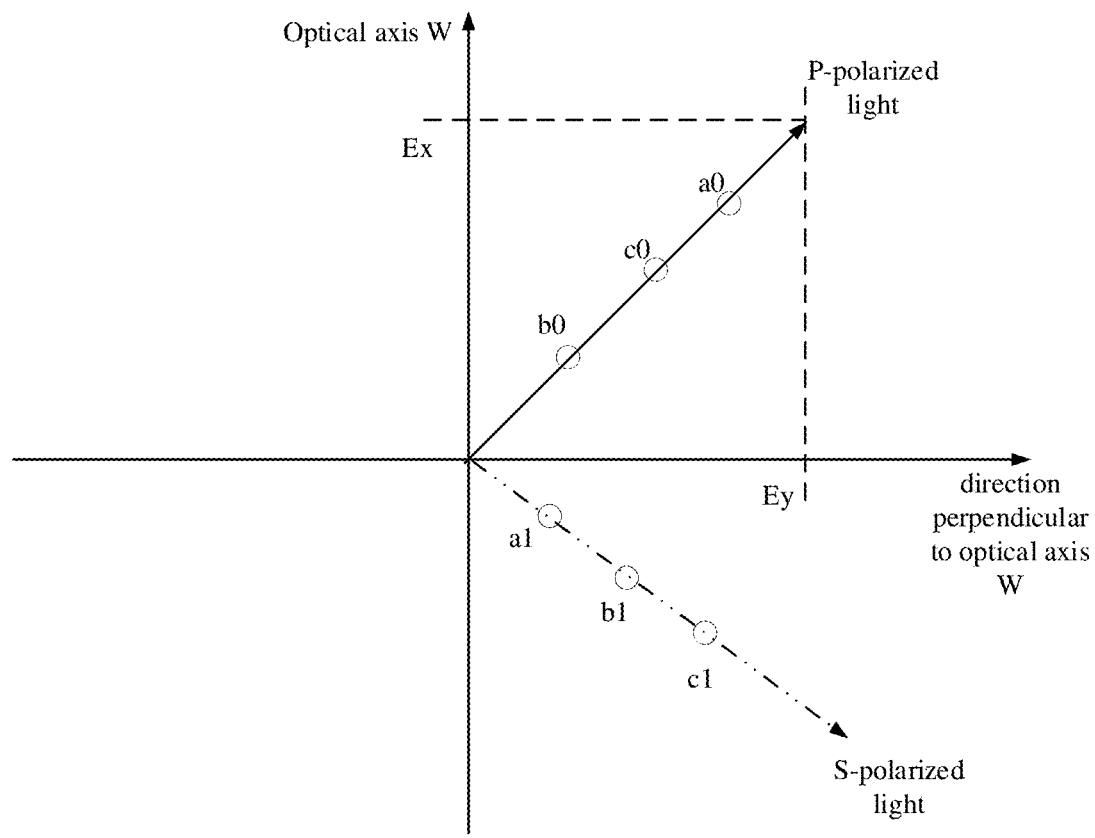
Figures 3, 6A:
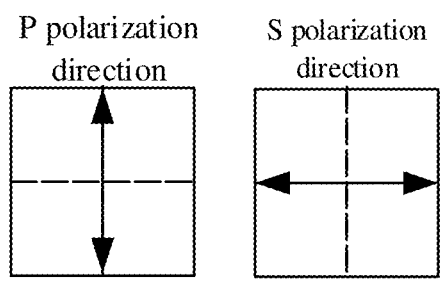

The phase delaying component 130 is a wave plate corresponding to a wavelength of a certain color, which affects the degree of change in phase of a transmitted beam by the thickness of grown crystal. In some embodiments, the phase delaying component 130 is a half-wave plate, also called a λ½ wave plate, which may change the phase of beam transmitted through the wave plate by π, that is, 180 degrees, and rotate the polarization direction thereof by 90 degrees, for example, P-polarized light is converted into S-polarized light or the S-polarized light is converted into the P-polarized light. As shown in FIG. 6A-1, the material of the wave plate may be provided as a crystal. The crystal has its own optical axis W, and the optical axis W is located in the plane where the wave plate is. Thus, when the wave plate is disposed on the optical path as shown in FIG. 6A-1, the optical axis W of the wave plate and the optical axis O of the light source are perpendicular to each other.

As shown in FIG. 6A-2, a coordinate system is established with the optical axis W of the wave plate. The P-polarized light has components Ex and Ey in the coordinate system formed with the optical axis W and a direction perpendicular to the optical axis W. The components Ex, Ey may be represented by a light wave formula. The P-polarized light may be regarded as a spatial synthesis of two-dimensional waves for components Ex, Ey.

When the P-polarized light passes through the wave plate, its phase is changed by π, that is, 180 degrees, and the phases of the components Ex, Ey each have a change amount of π. Thus, after the phases of light waves b0, c0, and a0 for the original P-polarized light at a certain moment are changed by 180 degrees, the polarization positions of the two components Ex, Ey in space are changed to form light waves b1, c1, and a1, thereby being converted into the S-polarized light. The change in spatial position of the light waves b0, c0, a0 and b1, c1, a1 are merely illustrative.

After passing through the half-wave plate, the original P-polarized light is converted into the S-polarized light, and as shown in FIG. 6A-3, polarization directions of the P-polarized light and the S-polarized light are perpendicular to each other.

In FIG. 5A-2, both the blue light and the green light emitted by the laser assembly 110 transmit through the phase delaying component 130 and then are incident into the beam combination mirror beam combination mirror group 120. Further, as shown in FIG. 5A-3, the phase delaying component 130 is fixed inside the housing 150 in a clamp fixing manner without blocking the optical path.

The beam combination mirror group 120 includes a plurality of beam combination mirrors, is configured to combine beams of different primary colors, so as to exit the combined beam from the opening 152 of the laser light source. As shown in FIG. 5A-3, the beam combination mirror group 120 includes three beam combination mirrors 1201, 1202, and 1203 which are sequentially disposed on the light transmission path of the laser. Specifically, beam combination mirrors are disposed respectively on a light emitting path of corresponding color light emitting region to reflect the beam emitted from the corresponding color light emitting region. The reflected beam propagates in a light emitting direction of the laser light source, and the respective color beams combine to form white light.

A plurality of beam combination mirrors and the light emitting direction of corresponding light emitting region may have an angle for reflecting the beam emitted from the corresponding light emitting region to the light emitting direction of the laser light source. For example, a plurality of beam combination mirrors are sequentially arranged toward the light emitting direction of the laser light source, and at least one beam combination mirror is configured such that a beam of corresponding color in other light emitting region may be transmitted through that the at least one beam combination mirror. In this way, the beam of corresponding color in other light emitting region and the beam reflected by the at least one beam combination mirror may be combined and then emitted out along the light emitting direction of the laser light source.

Specifically, angles between a light receiving surface of the first beam combination mirror 1201, the second beam combination mirror 1202, and the third beam combination mirror 1203 and the green laser light, the blue laser light, and the red laser light emitted from the light emitting regions of the laser assembly may be configured to 45°±2°. The first beam combination mirror 1201 is a reflector, and the second beam combination mirror 1202 and the third beam combination mirror 1203 are both dichroic filters. The first beam combination mirror 1201, the second beam combination mirror 1202, and the third beam combination mirror 1203 are disposed in parallel to each other.

Figure 5D:
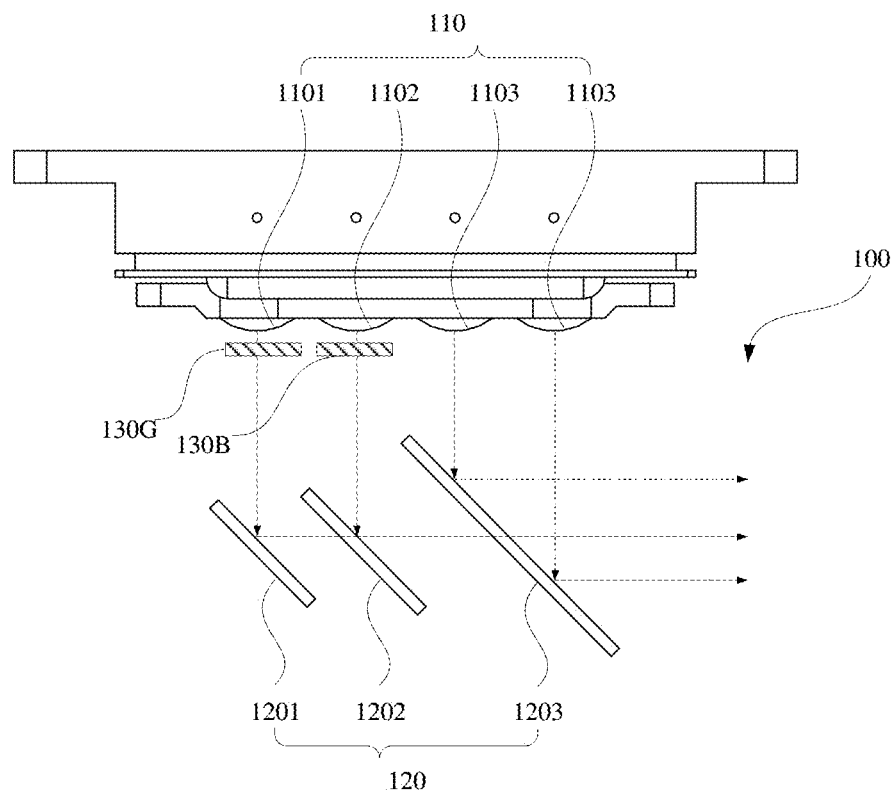
FIG. 5D is a schematic view illustrating a structure of a light source unit according to one or more examples of the present application according to one or more embodiments.

The phase delaying component 130 may be specifically half-wave plates 130G and 130B. As shown in FIG. 5D, the half-wave plate 130G is disposed between a light emitting surface of the green laser light emitting region 1101 of the laser and the first beam combination mirror 1201; and the half-wave plate 130B is disposed between a light emitting surface of the blue laser light emitting region 1102 and the second beam combination mirror 1202.

Specifically, the half-wave plate as the phase delaying component 130 may be disposed in parallel to the light emitting surfaces of the green laser light emitting region 1101 and the blue laser light emitting region 1102. Further, there may be one half-wave plate, and the size of the half-wave plate may be the same as that of the light emitting surfaces of the green laser light emitting region 1101 and the blue laser light emitting region 1102, so that beams of both of the two colors can be received.

In some embodiments, the first beam combination mirror 1201, as a reflector, reflects green light transmitted through the half-wave plate 130G; the second beam combination mirror 1202 transmits green light and reflects blue light transmitted through the half-wave plate 130B; the third beam combination mirror 1203 transmits green light and blue light and reflects red light, so that the three primary color beams are output in the same direction, that is, in a direction toward the opening 152 of the housing 150, and are combined to form a combined beam. The first beam combination mirror 1201, the second beam combination mirror 1202, and the third beam combination mirror 1203 are fixed via an integrated base, which may reduce the cumulative tolerance of multiple structures and is convenient for maintaining the same angle set among a plurality of beam combination mirrors and mutual relative positional relationship. The phase delaying component 130 may also be fixed via an integrated base.

In some embodiments, in the MCL packaged laser, there are two rows or columns of red laser beams. Correspondingly, the third beam combination mirror 1203 is configured to receive two rows of red laser beams and has a size larger than the first beam combination mirror 1201 and the second beam combination mirror 1202 to be able to receive all beams output from the second beam combination mirror 1202.

The beams from the light source are incident into the beam shaping component 112 after being combined, and the beam shaping component 112 generally performs contraction, homogenization and other processing on the beams.

The beam shaping component 112 may be provided as a focusing lens. The beams emitted from the laser assembly 110 are combined by the beam combination mirror group 120 and then are emitted out in a direction toward the opening 152 of the light source unit 100. In order to further obtain a beam having a small sized light spot, a focusing lens as the beam shaping component 112 is also provided at the opening 152. The focusing lens is capable of converging the combined beam to reduce the spot size.

The diffusion unit 140 may be disposed on the light emitting path of the light source, and the diffusion unit 140 is disposed on the light emitting path of the focusing lens as the beam shaping component 112. The diffusion unit 140 may be provided as a rotatable diffuser forming a diffusion wheel structure. After being rotated and diffused by the diffusion unit 140, speckle of the beam may be dissipated to improve the beam quality and reduce the speckle effect of the projected image. The beam diffused by the diffusion unit 140 may enter an optical homogenizing component 250 as shown in FIG. 5A-3. Specifically, the optical homogenizing component may be provided as a light-pipe or a fly-eye lens assembly.

As shown in FIG. 2B, the optical homogenizing component 250 is typically an optical homogenizing component for providing an illumination beam to an optical modulator, such as the DMD chip 220, in the lighting system 200. The beam after passing through the optical homogenizing component 250 further passes through a plurality of lenses, for example, a TIR (Total Internal Reflection) prism or an RTIR (Reflective total internal reflection) prism, and then is incident into the DMD chip 220 as an optical modulator. The light emitting surface of the optical homogenizing component 250 and the light incidence surface of the DMD chip 220 are in a conjugate object-image relationship.

According to the above description, due to different luminescent mechanisms of different luminescent materials, the red laser light, the blue laser light and the green laser light are linearly polarized light, and the polarization direction of the red laser light differs from that of the blue laser light and the green laser light in 90 degrees. In some embodiments, the red laser light emitted by the MCL laser assembly is P-polarized light, and the blue laser light and the green laser light emitted by the MCL laser assembly are S-polarized light.

In a specific implementation, there may be one half-wave plate as the phase delaying component 130. Optionally, the half-wave plate 130 is designed according to the wavelength of the green laser light. Therefore, the green laser light, after being transmitted through the half-wave plate 130, is rotated in a polarization direction by 90 degrees and converted to P-polarized light from the original S-polarized light. After the blue laser light is transmitted through the half-wave plate 130, since the wavelength of the half-wave plate does not correspond to the wavelength of the blue laser light, the blue laser light is deflected in the polarization direction, but not by 90 degrees, so that the polarization direction of blue laser light transmitted through the half-wave plate 130 is close to the P polarization direction.

In a specific implementation, there may be two half-wave plates as the phase delaying component 130, which are set respectively with respect to the wavelengths of the green laser light and the blue laser light, so that the polarization directions of the green laser light and the blue laser light may be changed by 90 degrees, that is, both of them are converted into P-polarized light. Alternatively, there is one half-wave plate 130, but it is divided into two plated regions which are disposed respectively with respect to the green laser light emitting region and the blue laser light emitting region.

When there are two half-wave plates 130 or the half-wave plate 130 includes two plated regions, as shown in FIG. 5D, they are disposed respectively on the light emitting paths of the blue laser light and the green laser light. The half-wave plate 130B region and the half-wave plate 130G region may be fixed in the housing via a common support structure, and receive laser beams respectively from the blue laser light emitting region 1102 and the green laser light emitting region 1101 of the laser assembly. Specifically, the half-wave plate 130B is disposed on the optical path of the blue laser light incident into the second beam combination mirror 1202, and the half-wave plate 130G is disposed on the optical path of the green laser light incident into the first beam combination mirror 1201. When one half-wave plate is used for each laser light, for example, the half-wave plates 130G and 130B, a more accurate phase delay may be performed as compared to a manner in which the blue laser light and the green laser light share the same half-wave plate for phase delay. Therefore, it is possible to obtain green polarized light and blue polarized light in the P polarization direction close to a theoretical value.

The same optical lens has the same transmittance and reflectivity to the same P-polarized light or the same S-polarized light with different wavelengths. The optical lens herein includes not only the aforementioned beam shaping component 112, i.e., the focusing lens, but also a lens group on the illumination optical path in the lighting system 200 and a refractive lens group 310 in the lens unit 300. Therefore, when the beam emitted by the laser light source passes through the entire projection optical system, the difference in transmittance and reflectivity is the result of overlaying of the entire system, and becomes more apparent during projection imaging.

Before the phase delay is applied without a half-wave plate, especially when the primary color light is linearly polarized light in P and S directions, whether an optical lens in an optical system or a projection screen has an obvious selective transmission to P-polarized light and S-polarized light. For example, as the incidence angle of the projection beam is different, the transflectivity of the projection screen to P-polarized light (red light) is significantly greater than that to S-polarized light (green and blue light). This causes the problem of uneven local chromaticity of the projected image, that is, the phenomenon of "color speckle" and "color patch" appearing on the projected image.

In some embodiments, by providing the half-wave plate 130 on the light emitting paths of the blue laser light and the green laser light, in particular, by providing the half-wave plates 130B and 130G corresponding to wavelengths respectively of the blue laser light and the green laser light, the phase changes of the same deflection angle may be performed respectively with respect to the polarization directions of the blue laser light and the green laser light, for example, the S polarization direction is converted into the P polarization direction, thereby being the same as the polarization direction of the red laser light. Thus, when passing through the same optical imaging system and being reflected into the human eyes through the projection screen, the optical lens in the optical system has the same transmittance to the blue laser light and the green laser light which are converted into P-polarized light as the red laser light which is P-polarized light, and the difference in reflectivity of the projection screen to the laser light of three colors is also reduced, so that the consistency of the light processing performed by the entire projection system on the three primary color light is improved, thereby effectively eliminating the local color aberration phenomenon present on the projected image.

In some embodiments, when a half-wave plate for one color wavelength, for example, a half-wave plate for a green wavelength, is provided on the light emitting paths of the blue laser light and the green laser light, the green laser light is converted from S-polarized light into P-polarized light and the blue laser light is converted close to P-polarized light after being transmitted through the half-wave plate, so that the consistency of the light processing performed by the entire system on the RGB three primary color light may be also improved, thereby greatly reducing the uneven chromaticity appearing on the projected image locally. Moreover, the use of a half-wave plate to simultaneously transmit beams in two color wavelength ranges may be more simplified in structure settings. Further, the half-wave plate may also be provided for the blue wavelength. Correspondingly, the blue laser light may change in the polarization direction by 90 degrees. The polarization direction of the green laser light does not change by 90 degrees, but a large deflection also occurs with respect to the original polarization direction.

Since the transmittance of the optical lens in the optical system to the P-polarized light is generally greater than that to the S-polarized light, and the reflectivity of the projection screen to the P-polarized light is greater than that to the S-polarized light, the laser light of RGB three color is P-polarized light by converting the blue laser light and the green laser light that are S-polarized light into P-polarized light, which may improve the light transmission efficiency of the projection beam in the entire system, thereby improving the brightness and quality of the overall projected image.

Figure 5E:
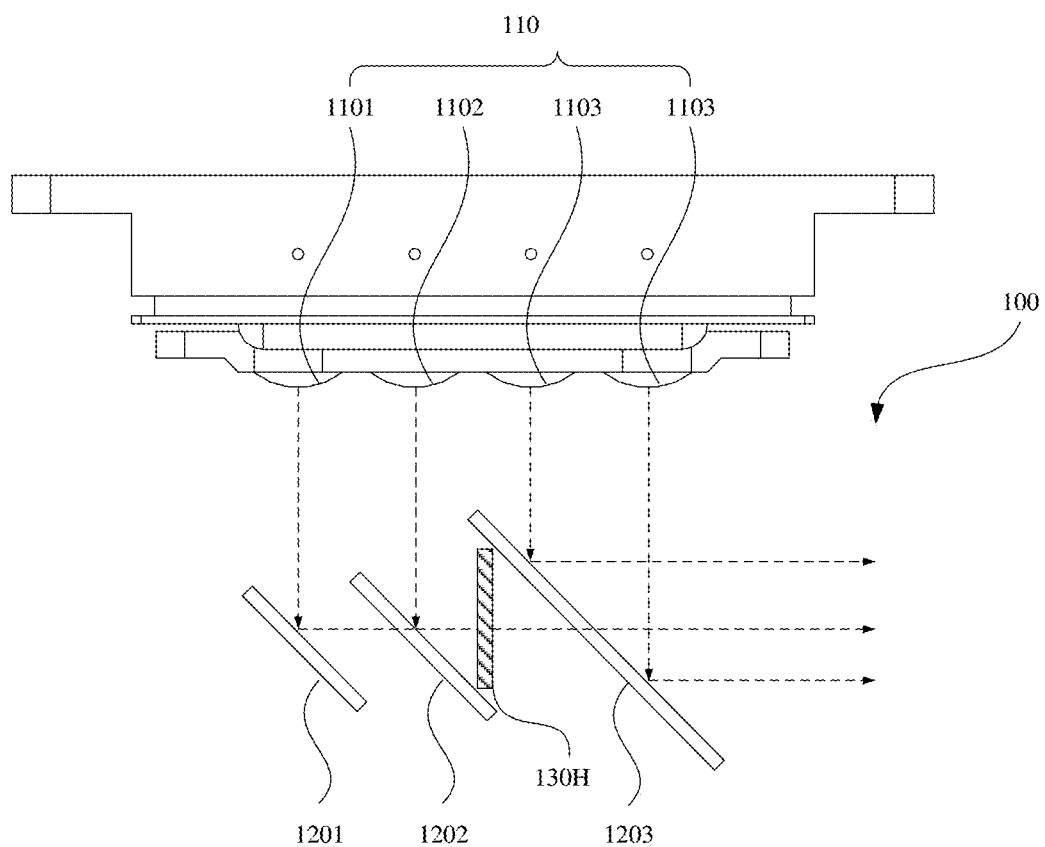
FIG. 5E is a schematic view illustrating a structure of another light source unit according to one or more embodiments.

In some embodiments, the blue laser light and the green laser light may be combined first and then combined with the red laser light, and the half-wave plate may be disposed on an optical path before the blue laser light and the green laser light are combined with the red laser light. Specifically, as shown in FIG. 5E, the half-wave plate 130H may be disposed between the second beam combination mirror 1202 and the third beam combination mirror 1203, and may transmit the combined beam of the blue laser light and the green laser light emitted from the second beam combination mirror 1202. At this time, the half-wave plate 130H is coated for one color wavelength instead of depending on the light emitting regions, so that both the blue laser light and the green laser light pass through the half-wave plate corresponding to one of their wavelengths. In this way, the consistency of the light processing performed by the entire system on the RGB three primary color light may be improved, and the uneven chromaticity appearing on the projected image locally may be also improved effectively, the principle of which is not described again.

Figure 7:
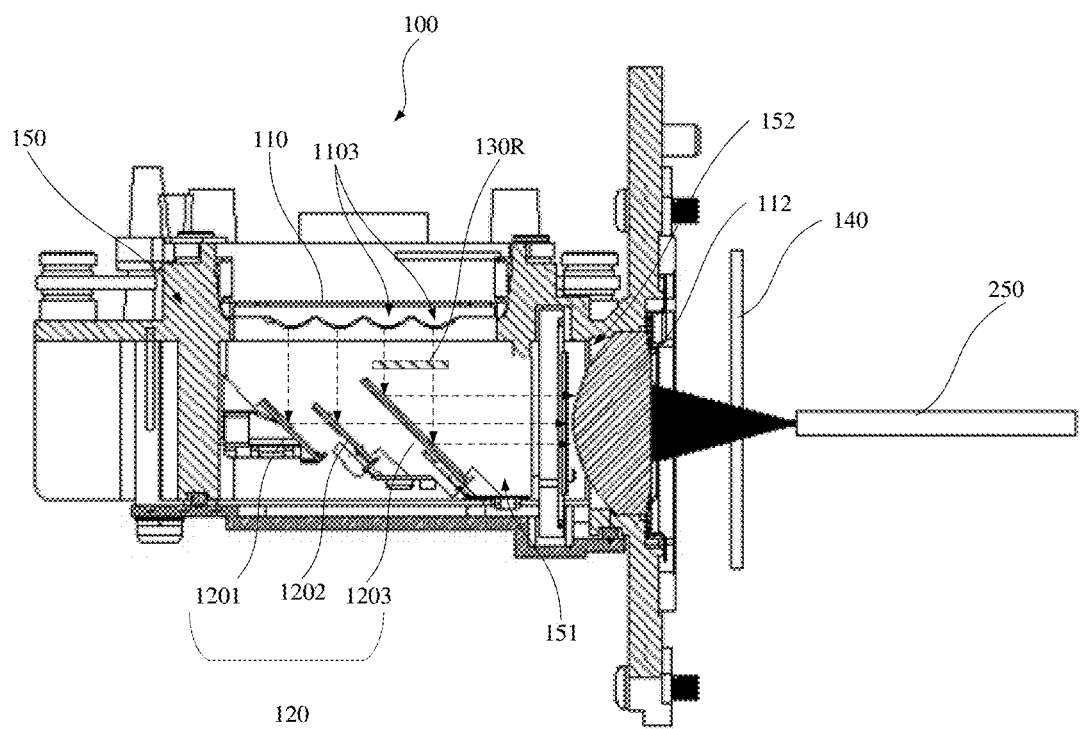
FIG. 7 is another schematic view illustrating a cross-sectional structure of a light source unit of a laser projector according to one or more embodiments.

FIG. 7 is another schematic view illustrating a cross-section structure of a light source of a laser projector according to one or more embodiments. Compared with the light source shown in FIG. 5A-3, the phase delaying component is specifically a half-wave plate 130R, which is disposed on the light emitting path of the red laser beam and is located before the red laser beam is combined with the blue laser beam and the green laser beam. As shown in FIG. 7, it is disposed between a red laser light emitting region 1103 and a third beam combination mirror 1203.

The half-wave plate 130R is provided corresponding to the red laser light. Thus, the polarization direction of the red laser light may be rotated by 90 degrees after passing through the half-wave plate 130R, so that the red laser light is converted from P-polarized light into S-polarized light.

Due to the difference in reflectivity of the ultra-short-throw projection screen to P-polarized light and S-polarized light, and the difference in transmittance of optical lenses in the projection optical system to the P-polarized light and the S-polarized light, the luminous flux of the three colors is unbalanced, in particular, at certain projection angles, resulting in the presence of local color aberration phenomenon on the projected image received by human eyes finally.

In some embodiments, by providing the half-wave plate 130R on the red laser light output path, the red laser light that was originally P-polarized light is converted into S-polarized light so as to coincide with the blue laser light and the green laser light in polarization directions. Thus, the projection optical system has reduced difference in transmittance to the red laser light, blue laser light and green laser light which are S-polarized light, and the ultra-short-throw projection screen has substantially the same reflectivity to the red laser light, blue laser light and green laser light which are S-polarized light. Therefore, the consistency of light processing performed on each primary color light is improved, and the uneven chromaticity present on the projected image may be eliminated or improved.

Since the transmittance of the ultra-short-throw projection screen and the system optical lens to the P-polarized light is slightly larger than that to the S-polarized light, when the example above is applied, the red laser light is converted into the S-polarized light. Although it will bring a certain light loss to the red laser light, since the structure of the half-wave plate is provided only for the red laser light, the consistency of polarization directions of the three-color laser beams is more easily realized while the structural arrangement is simplified.

Figure 8A:
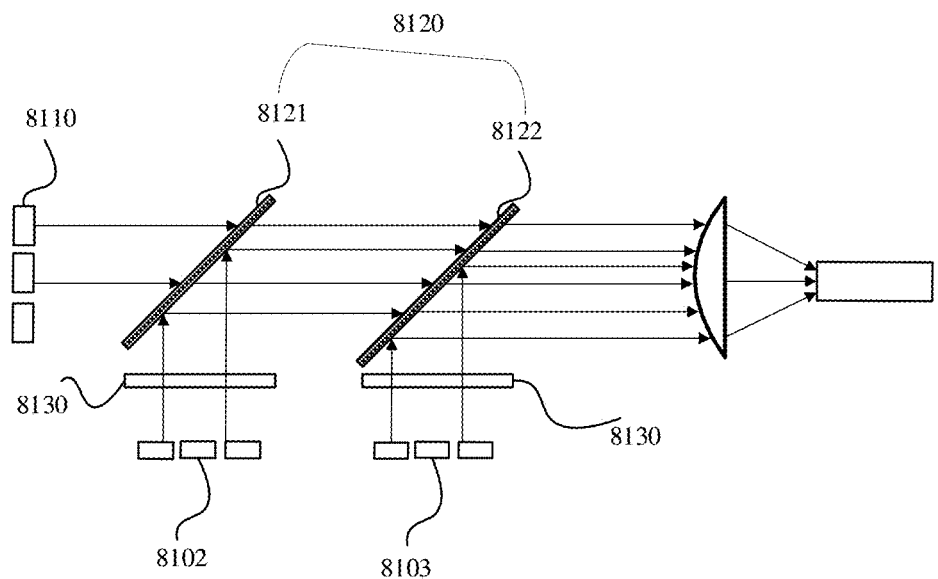
FIG. 8A is another schematic view illustrating a structure of a light source unit of a laser projector according to one or more embodiments.

A laser projector is provided in example above, which is applied to a light source unit structure as shown in FIG. 8A.

FIG. 8A is another schematic view illustrating a structure of a light source unit of a laser projector according to one or more embodiments. Unlike the light source units above, a red laser light emitting region, a blue laser light emitting region, and a green laser light emitting region in the light source unit of this example are formed respectively of individually packaged laser assemblies. And each of the laser assemblies may be provided as a BANK laser (may also be referred to as laser bank) or an MCL laser (Multi-Chip Laser).

As shown in FIG. 8A, the light source unit in a laser projector includes at least three sets of laser assemblies, each of which emits a laser beam different from the other two ones.

A laser assembly 8110 emits a first color light, a laser assembly 8102 emits a second color light, and a laser assembly 8103 emits a third color light.

The beams from the three sets of laser assemblies are combined by a beam combination mirror group 8120. Referring to FIG. 8A, the beam combination mirror group 8120 includes a fourth beam combination mirror 8121 and a fifth beam combination mirror 8122. The fourth beam combination mirror 8121 and the fifth beam combination mirror 8122 may be both dichroic filters.

The fourth beam combination mirror 8121 transmits the first color laser light and reflects the second color laser light to the fifth beam combination mirror 8122. The fifth beam combination mirror 8122 transmits the first and second color laser light and reflects the third color laser light. Thus, the laser light of the first, second and third color is combined to output via the fifth combining mirror 8122.

In a specific implementation, the first color is red, the second color is green, and the third color is blue. Thereby, the fourth beam combination mirror 8121 transmits the red light and reflects the green light, and the fifth beam combination mirror 8122 transmits the red and green light and reflects the blue light.

On an optical path of the green laser light incident into the fourth beam combination mirror 8121 and an optical path of the blue laser light incident into the fifth beam combination mirror 8122, half-wave plates 8130 are disposed in parallel to the light emitting region for the corresponding colors, the green laser light is transmitted through the half-wave plate 8130 and then incident into the fourth beam combination mirror 8121, and the blue laser light is transmitted through the half-wave plate 8130 and then incident into the fifth beam combination mirror 8122.

The forms and arrangements of the laser assemblies shown in FIG. 8A is different from that of the laser assemblies shown in FIG. 5B, but their principles of solving the local color aberration problem present on the projection screen is same, and will not be described herein again.

Figure 8B:
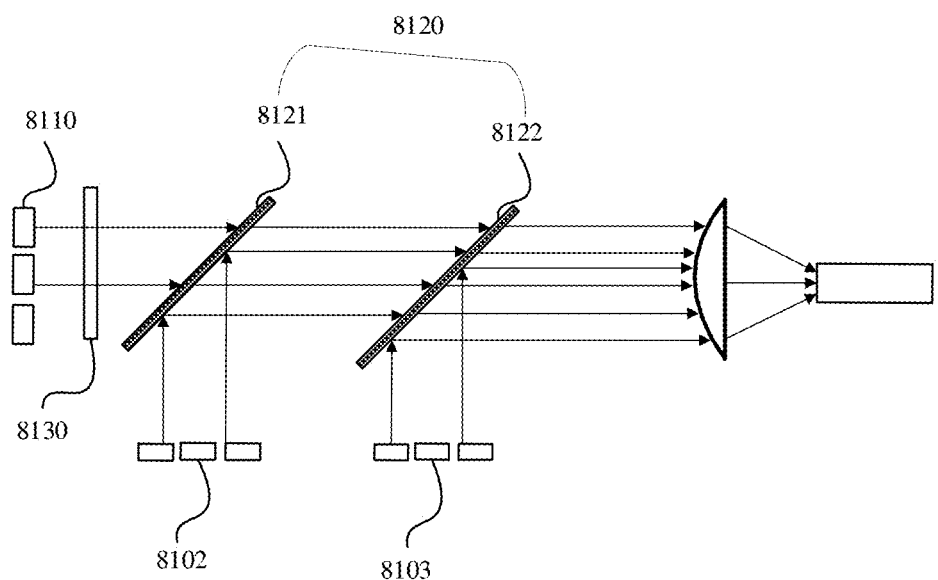
FIG. 8B is another schematic view illustrating a structure of another light source unit of the laser projector according to one or more embodiments.

Further, based on the laser assembly structures and arrangements shown in FIG. 8A, as another specific implementation, as shown in FIG. 8B, a half-wave plate for red color may be also disposed on a light emitting path of the red laser light, and the red laser light is converted from P-polarized light into S-polarized light. Please refer to the related description in the application and details are not described herein again.

It should be noted that, the arrangement of the assemblies for the red laser light emitting region, the blue laser light emitting region, and the green laser light emitting region is merely exemplified above. After the above-described arrangement is appropriately changed, the setting positions of the half-wave plates are adaptively changed. For example, when the first color is blue, the second color is green, and the third color is red, the half-wave plates may be disposed respectively in front of the fourth beam combination mirror 8121 into which the first color light is incident and in front of the fourth beam combination mirror 8121 into which the second color light is incident, or in a combined beam of the blue laser light and the green laser light, that is, between the fourth beam combination mirror 8121 and the fifth beam combination mirror 8122. This example may also achieve the purpose of eliminating uneven chromaticity present on the projected image locally, and the examples are not described herein again.

Figure 9A:
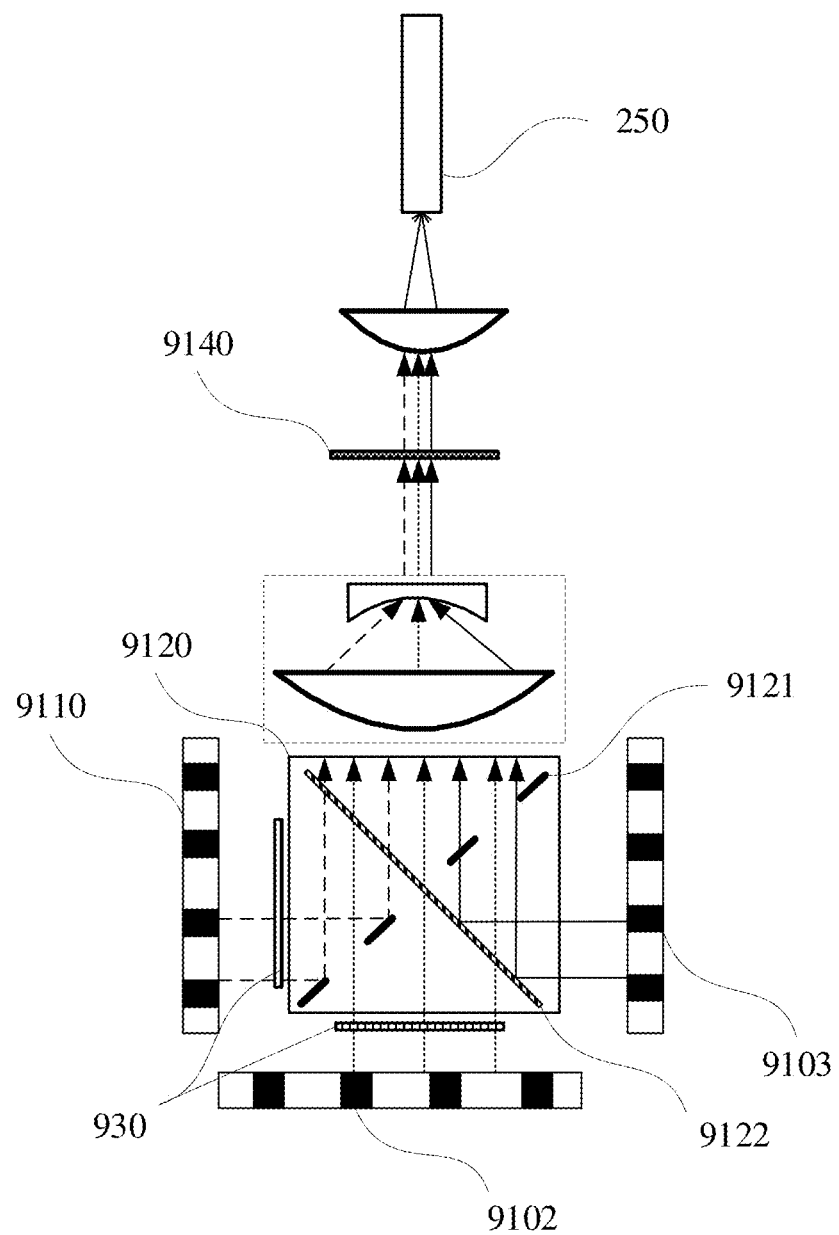
FIG. 9A is another schematic view illustrating a structure of a light source unit of a laser projector according to one or more embodiments.

FIG. 9A is another schematic view illustrating a structure of a light source unit of a laser projector according to one or more embodiments. Where a red laser light emitting region, a blue laser light emitting region and a green laser light emitting region are formed respectively of laser assemblies that are individually packaged. Each of the laser assemblies may be provided as a BANK laser or an MCL laser.

The laser projector includes at least three sets of laser assemblies, each of which emits a laser beam different from the other two ones.

In some embodiments, a laser assembly 9110 emits a green laser light, a laser assembly 9102 emits a blue laser light, and a laser assembly 9103 emits a red laser light, the emitted three-color laser light are combined by an X beam combination mirror 9120. As shown in FIG. 9A, the red laser light emitting region, the blue laser light emitting region, and the green laser light emitting region are adjacent to each other and are arranged around the X beam combination mirror 9120.

The X beam combination mirror group 9120 is formed of two dichroic filters in a center crossing manner, where the two dichroic filters are a sixth beam combination mirror 9121 and a seventh beam combination mirror 9122, respectively.

The green laser light emitted by the laser assembly 9110 is incident into the sixth beam combination mirror 9121 and is reflected by the sixth beam combination mirror 9121 to the seventh beam combination mirror 9122. The blue laser light emitted by the laser assembly 9102 is transmitted sequentially through the sixth beam combination mirror 9121 and the seventh beam combination mirror 9122. The red laser light emitted by the laser assembly 9103 is reflected by the seventh beam combination mirror 9122 to the sixth beam combination mirror 9121 and is transmitted through the sixth beam combination mirror 9121. Finally, the three laser beams are combined by the X beam combination mirror group 9120 including the sixth beam combination mirror 9121 and the seventh beam combination mirror 9122.

Further, the light source unit further includes a phase delaying component 930. Specifically, the phase delaying component 930 may be a half-wave plate. Referring to FIG. 9A, half-wave plates 930 are located respectively in the optical paths of the blue laser light and the green laser light incident on the X beam combination mirror group 9120. Thus, the blue laser light and the green laser light are incident into the X beam combination mirror group 9120 after a change in polarization direction by 90 degree.

Figure 9B:
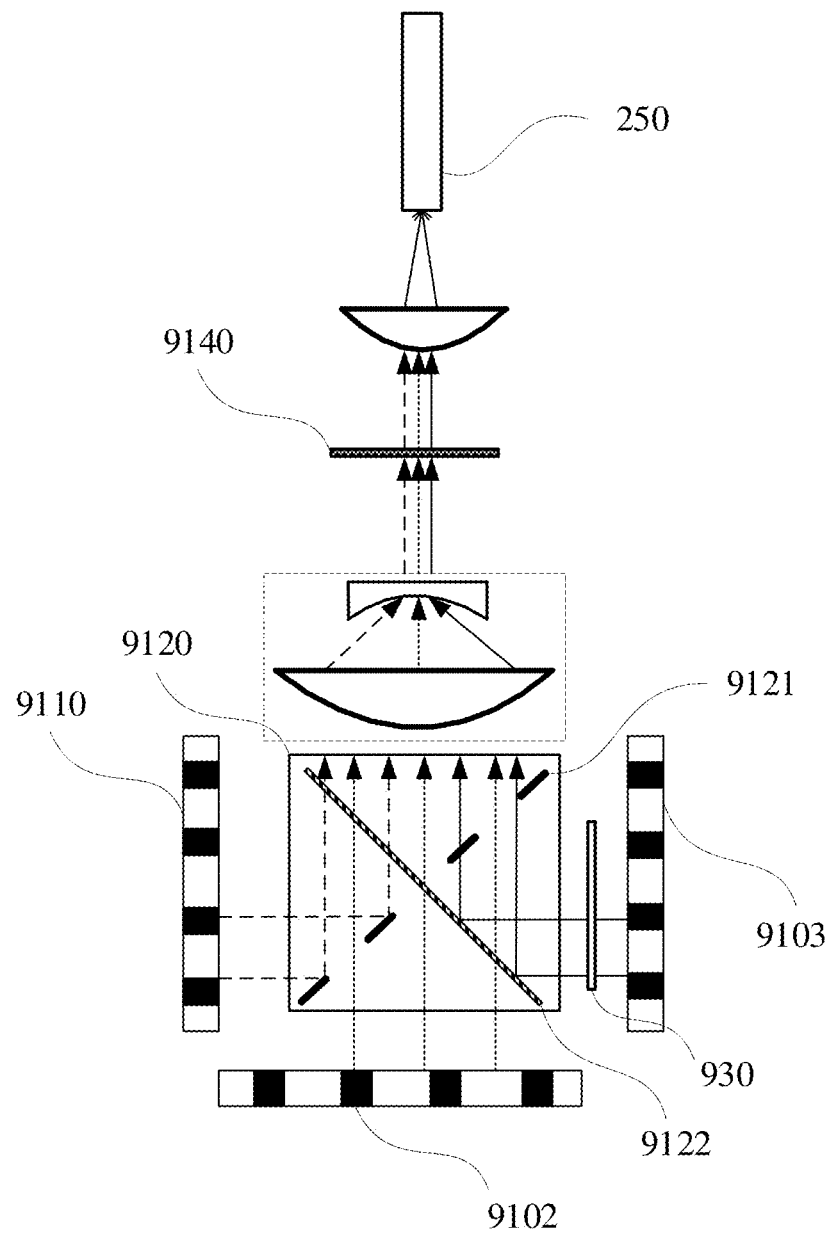
FIG. 9B is another schematic view illustrating a structure of another light source unit of the laser projector according to one or more embodiments.

Alternatively, as another implementation, referring to FIG. 9B, the half-wave plate 930 may also be located on the optical path of the red laser light incident on the X beam combination mirror group 9120. The red laser light is incident into the X beam combination mirror group 9120 after a change in polarization direction by 90 degree.

The laser projector with the light source unit shown in FIG. 9A and FIG. 9B also achieve the technical purpose of eliminating or improving the local color aberration phenomenon present on the projected image, which will not be described herein again.

Further, some embodiments, the laser light emitting regions of individual forms assemblies, or the light emitting regions in which the light emitting chips are arranged in an array, are generally provided in a rectangular shape. Correspondingly, the phase delaying component is disposed on the light emitting path of one or two colors light, and its shape is also rectangular. The long side and the short side of the rectangular laser light emitting region are respectively parallel to the long side and the short side of the rectangular light receiving region of the phase delaying component.

Due to the high energy of the laser beam, optical lenses such as lenses and prisms may vary with temperature during operation. The optical lenses form internal stresses in manufacturing process, and the internal stresses are released as the temperature changes, to form a stress birefringence. The stress birefringence may result in different phase delays for beams with different wavelengths, which may be considered as secondary phase delays. Therefore, on the actual optical path, the phase change of beam is based on the overlaying effect of the stress birefringence of the optical lenses and the half-wave plate, and the delay amount resulting from the optical lenses varies depending on the system design. When applying the technical solutions according to these examples of the present application, optionally, the secondary phase delay caused by the actual system may be corrected to approach or reach a theoretical value of 90 degrees by which the polarization direction of beam changes.

Figures 4, 6A:
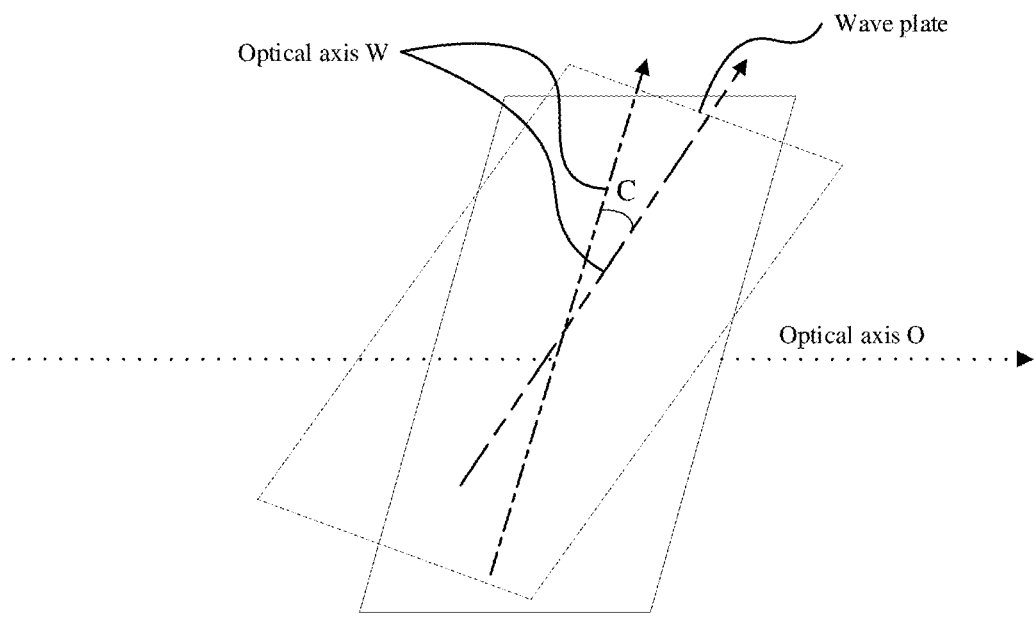

The half-wave plate has an optical axis in its plane. As shown in FIG. 6A-1, the optical axis W of the half-wave plate is spatially perpendicular to the optical axis O of the system, and the optical axis of the half-wave plate is parallel to the long or short side of the half-wave plate. When the solution of the example is specifically applied, as shown in FIG. 6A-4, the half-wave plate is configured to rotate at a preset angle, such as C degree, along a direction of a long side or a short side of the rectangular half-wave plate as shown by dotted lines in the figure. After deflection by the above angle, the optical axis of the half-wave plate also undergoes a deflection by about plus or minus C degrees, so that the phase change of beam is about 180 degrees±2 C. degrees, and then is overlaid with the secondary phase delay of the optical lenses in the system. Thus, the polarization direction of the beam is converted by about 90 degrees, which is close to a theoretical value. In the various embodiments described above, C may take a value of 10.

In some embodiments, with respect to a three primary color light having different polarization directions, by providing a half wave plate on the optical output path of the one or two colors light in the laser projector, the polarization direction of the one or two colors light transmitting through the half wave plate is converted to coincide with the polarization direction of other colors light, so that the difference in transmission of the projection optical system including the laser projector, especially a plurality of optical lenses, to the red, blue and green laser light is reduced, the reflectivity of the ultra-short-throw projection screen to the three primary color light is also substantially consistent, the consistency of light processing on each primary color light is improved, thereby the uneven chromaticity present on the projected image is eliminated or improved.

When half-wave plates are provided on the optical paths of the blue laser light and the green laser light which are S-polarized light, after the half-wave plates convert their polarization directions respectively, all of the three primary color light in the system are P-polarized light, which may not only eliminate the uneven chromaticity present on the projected image locally, but also increase the brightness of the projected image to some extent.

Further, when a half-wave plate is provided on the optical path of the red laser light which is P-polarized light, after the half-wave plate converts its polarization direction, all of the three primary color light in the system are S-polarized light, which may also eliminate the uneven chromaticity present on the projected image locally.

Figure 10:
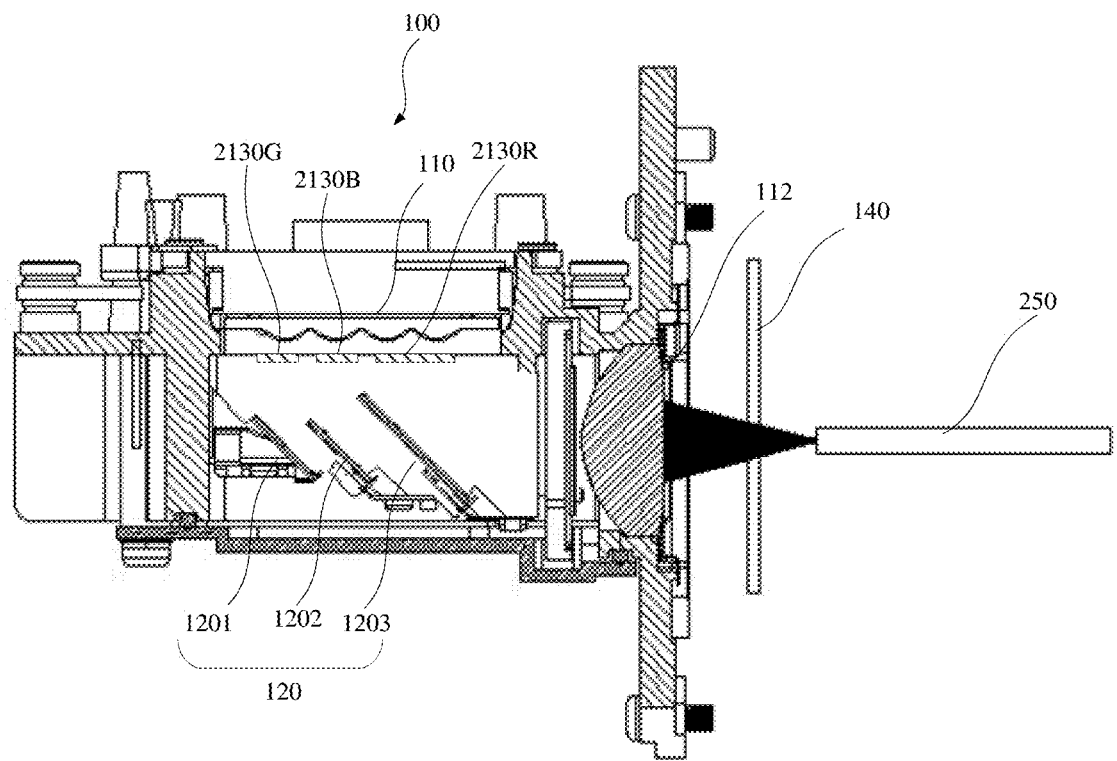
FIG. 10 is another schematic view illustrating a structure of a light source unit of a laser projector according to one or more embodiments.

FIG. 10 is another schematic view illustrating a structure of a light source unit of a laser projector according to one or more embodiments. As shown in FIG. 10, the light source unit 100 includes a laser assembly 110, and a beam combination mirror group 120 which is disposed on the optical output paths of red laser light, blue laser light and green laser light, and the combining mirror group 120 is configured to combine the red laser light, blue laser light and green laser light. The position and working principle of the related components have been described in the above examples, and will not be described herein again.

The red laser light, blue laser light and green laser light, after being combined by beam combination mirror group 120, are incident into the beam shaping component 112. In some embodiments, the beam shaping component 112 may be a focusing lens, or a combination of focusing lenses and fly-eye lenses. The beam shaping component 112 is configured to contract the combined beam, or to contract or homogenize the combined beam.

The combined three-color beam contracted by the beam shaping component 112 is incident into a diffusion wheel 140, and the diffusion wheel 140 rotates to diffuse and output the combined beam to an optical homogenizing component or a light collecting component 250.

The optical homogenizing component or the light collecting component 250 may be a light-pipe, which may be provided as an entrance to an illumination optical path of the lighting system. The red laser light emitting region, the blue laser light emitting region, and the green laser light emitting region in the laser assembly chronologically output the red laser light, the blue laser light, and the green laser light. The rotation period of the diffusion wheel 140 is consistent with the timing period of the three-color laser light. The laser assembly applied to the light source unit 100 is an MCL three-color laser array as shown in FIG. 5B, which will not be described herein again.

As shown in FIG. 10, the laser assembly is fixed on the housing of the light source unit 100 via screws, and emits three-color laser beams to the receiving cavity inside the housing. Moreover, a phase delaying component and a beam combination mirror group are disposed within the receiving cavity inside the housing toward the light emitting surface of the laser assembly.

Specifically, the beam combination mirror group 120 includes three beam combination mirrors sequentially disposed on the optical transmission path of the laser, which are a first beam combination mirror 1201, a second beam combination mirror 1202, and a third beam combination mirror 1203, and are configured to combine beams of different primary colors to output the combined beam from the opening of the laser light source. A beam combination mirror for respective colors is disposed on the light emitting path of the light emitting region corresponding to the color, so as to reflect a beam corresponding to the light emitting region. Reflected beams are propagated in the light emitting direction of the laser light source, and the respective color beams are combined to form white light.

A plurality of beam combination mirrors may have angles with the light emitting directions of the corresponding light emitting regions, thereby reflecting the beams emitted from the light emitting regions to the light exiting direction of the laser light source. For example, a plurality of beam combination mirrors are arranged sequentially toward the light exiting direction of the laser light source, and at least one beam combination mirror may transmit the beams emitted by other light emitting regions. The beams emitted by the other light emitting regions and a beam reflected by the at least one beam combination mirror is combined to exit along the light emitting direction of the laser light source.

Specifically, an angle between the light receiving surface of the first beam combination mirror 1201 and green laser light from the corresponding light emitting region of the laser assembly 110, an angle between the second beam combination mirror 1202 and blue laser light from the corresponding light emitting region of the laser assembly 110, an angle between the third beam combination mirror 1203 and red laser light from the corresponding light emitting region of the laser assembly 110 may be all configured to 45°±2°. The first beam combination mirror 1201 is a reflector. The second beam combination mirror 1202 and the third beam combination mirror 1203 are dichroic filters. The first beam combination mirror 1201, the second beam combination mirror 1202 and the third beam combination mirror 1203 are disposed in parallel to each other.

The laser light of each color also passes through the phase delaying component before being incident into the beam combination mirror group 120 for beam combination. As shown in FIG. 10, between the light emitting region of each color laser light and corresponding beam combination mirror, a quarter-wave plate corresponding to the color is provided, which is a wave plate 2130G, a wave plate 2130B, or a wave plate 2130R respectively. The wave plate 2130G transmits the green laser light emitted from the green laser light emitting region, and delays the phase of the green laser light by 45 degrees, so that the polarization direction thereof is rotated by 45 degrees and then incident into the first beam combination mirror 1201 which is a reflector. Similarly, the wave plate 2130B transmits the blue laser light emitted from the blue laser light emitting region, and delays the phase of the blue laser light by 45 degrees, so that the polarization direction thereof is rotated by 45 degrees and then incident into the second beam combination mirror 1202. In addition, the second beam combination mirror 1202 simultaneously transmits the green laser light reflected by the first beam combination mirror 1201 and reflects the blue laser light to form a combined beam, which incident into the third beam combination mirror 1203. The wave plate 2130R transmits the red laser light emitted from the red laser light emitting region, and delays the phase of the red laser light by 45 degrees, so that the polarization direction thereof is also rotated by 45 degrees. The third beam combination mirror 1203 reflects the red laser light whose polarization direction is changed, and transmits the blue laser light and the green laser light so as to complete the beam combination of the three primary color light.

Figure 6B:
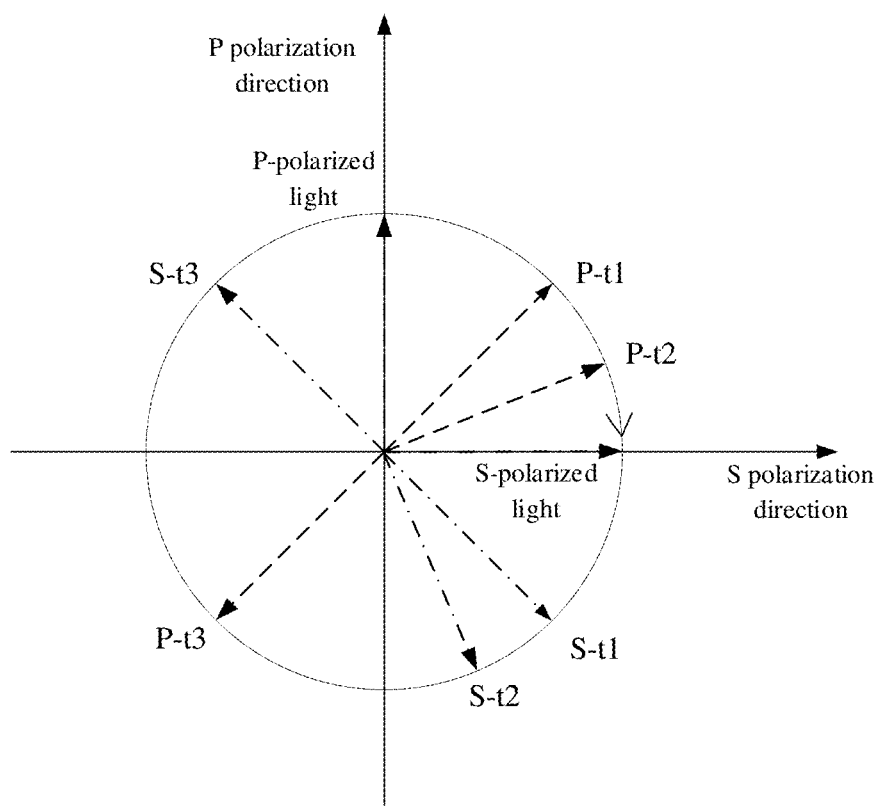
FIG. 6B is a schematic view illustrating circularly polarized light according to one or more embodiments.
Figure 6C:
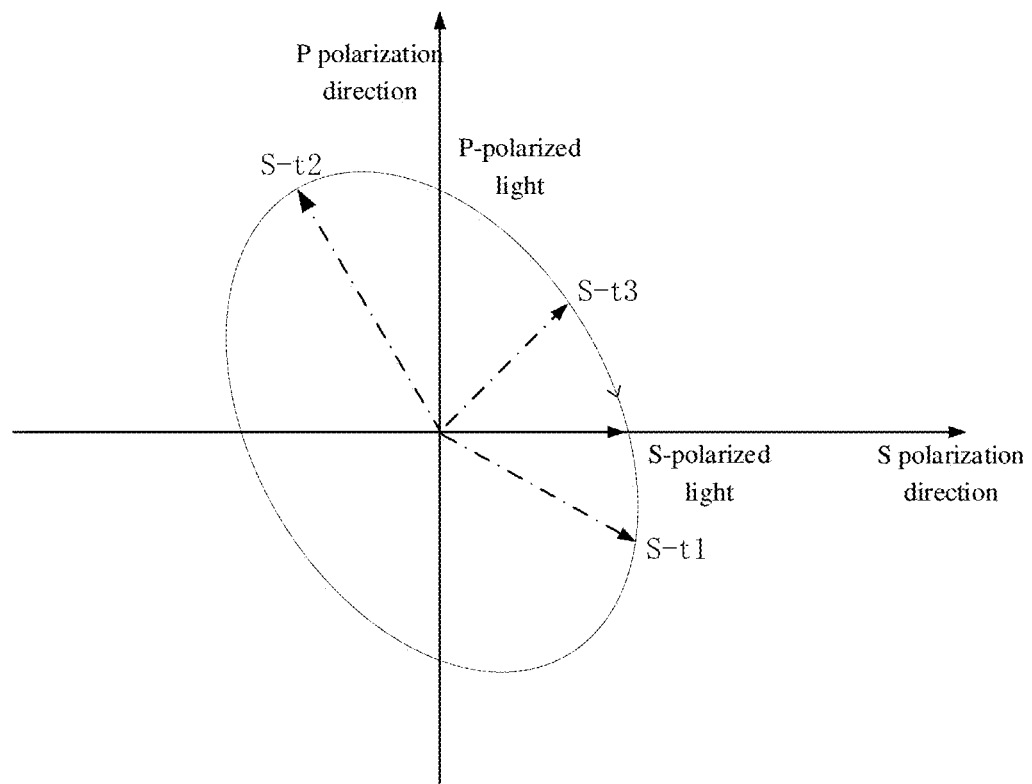
FIG. 6C is a schematic view illustrating elliptically polarized light according to one or more embodiments.

FIG. 6B is a schematic view illustrating the principle of the quarter-wave plate for delaying the phase of beam. A coordinate system is established by taking the P polarization direction and the S polarization direction as coordinate axes. The polarized light in original P polarization direction, after passing through the quarter-wave plate, is converted into polarized light P-t1, P-t2, P-t3 which are in a plurality of polarized directions between the coordinate axes at different times such as t1, t2, t3, thereby forming circularly polarized light. Similarly, the S-polarized light, after passing through the quarter-wave plate, is also converted into polarized light S-t1, S-t2, S-t3 which are in a plurality of polarization directions between the coordinate axes at different times such as t1, t2, t3, thereby forming circularly polarized light. That is, the polarization direction of the originally linearly polarized light is converted to multidirectional over a period of time. Circularly polarized light is deflected in a certain direction, such as clockwise. Therefore, although its polarization direction is multidirectional, it still conforms to certain laws. Further, if the linearly polarized light passes through a quarter-wave plate that does not correspond to its own wavelength, it may be converted into elliptically polarized light, as shown in FIG. 6C.

In conjunction with the example embodiment in FIG. 10, the green laser light after passing through the quarter-wave plate 2130G and the blue laser light after passing through the quarter-wave plate 2130B are converted from the originally linearly S-polarized light into circularly polarized light. The circularly polarized light has components in both the P direction and the S direction which are changing sinusoidally with time, and amplitudes of the components are equal. If the amplitudes of the components in the P direction and the S direction are not equal, it is converted into elliptically polarized light. The red laser light, after passing through the quarter-wave plate 2130R, is also converted from the originally linearly P-polarized light into circularly polarized light. Thus, the originally linearly polarized light in different polarization directions is converted into circularly polarized light (not the same circularly polarized light), and has components with equal amplitude in the S direction and the P direction.

Since optical lenses in the projection optical system have a difference in transmittance to light (P-polarized light and S-polarized light) in different polarization directions, when the beam passing through the projection lens 300 is projected onto the projection screen, due to the characteristics of the screen material, the difference in reflectivity to light in different polarization directions, especially to the linearly polarized light in which the two polarization directions of P-polarized light and S-polarized light are perpendicular in the light source unit in this example. The difference in polarization direction of light from the light source, after passing through the system optical lens and being projected onto the projection screen, is overlaid with the difference in transmittance and reflectivity to light in different polarization directions, resulting in local color aberration phenomenon such as "color speckle" and "color patch" present on a projected image, which seriously affects the image quality.

By providing the quarter-wave plate in the laser projector, the three primary color laser beams are respectively converted from linearly polarized light into circularly polarized light through the quarter-wave plate. The circularly polarized light has a P-direction component and an S-direction component at different times, and the amplitude extremes of the two components are equal. In certain integration time, regardless the linearly polarized light is P-polarized light or S-polarized light before, which has both the P-direction component and the S-direction component after being converted into circularly polarized light. Moreover, for optical lenses, the difference in overall transmittance of circularly polarized light with different wavelengths is reduced. This makes it possible that when the combined beam of the three primary color laser beams is incident into the projection screen, although the projection screen medium has different reflectivity to light in different polarization directions, since light with different wavelengths has components in different polarization directions, the difference in reflectivity of the projection screen to the light with different wavelengths is reduced on the whole, thereby effectively improving the local color aberration phenomenon present on a projected image due to the different polarization directions of the three primary color light.

In some embodiments, the wave plate 2130G may be disposed on the optical path of the green laser light incident into other beam combination mirror, such as disposed between the first beam combination mirror 1201 and the second beam combination mirror 1202, which may also achieve the above technical effects and will not be described herein again.

In some embodiments, in order to decrease the number of quarter-wave plates or to simplify the installation structure, two or three quarter-wave plates may be simplified to one quarter-wave plate, which may be disposed for the wavelength of one color. In this way, light of this color is converted from linearly polarized light into circularly polarized light after passing through the quarter-wave plate, and light of the other one or two colors is converted from linearly polarized light into elliptically polarized light after passing through the quarter-wave plate. The elliptically polarized light also has components in the P direction and the S direction, but the component amplitudes are different, as shown in FIG. 6C.

In some embodiments, after simplifying two quarter-wave plates for the blue laser light and the green laser light to one quarter-wave plate, the simplified quarter-wave plate corresponds to the wavelength of the green laser light, and may be disposed on the optical path of a combined beam of two colors laser light such as on the optical path of a combined beam of the blue laser light and the green laser light. For example, the quarter-wave plate may be disposed between the second beam combination mirror 1202 and the third beam combination mirror 1203, as shown in FIG. 10.

Alternatively, since the blue laser light emitting region and the green laser light emitting region are adjacent to each other, one large quarter-wave plate may be disposed for the two light emitting regions. At the same time, for the quarter-wave plate of the red laser beam, reference is still made to the original setting mode.

Alternatively, one quarter-wave plate is disposed on the optical path of the combined beam of the three-color laser light, such as disposed on the optical output path of the beam combination mirror group 120. Alternatively, the diffusion unit 140 may have a structure of one quarter-wave plate, or the diffusion unit may be provided as a diffusion wheel. The light incidence surface of the diffusion wheel may be provided with a wave plate crystal, and the light exiting surface of the diffusion wheel may have a diffusion microstructure.

Alternatively, when only one quarter-wave plate is disposed in the laser projector, the quarter-wave plate may be disposed at a plurality of positions of the optical path of the combined three-color beams, such as on the light incidence surface or the light exiting surface serving as the light-pipe of the optical homogenizing component 250, or on the optical path from the DMD to the lens, which will not be described in detail herein. Reference is made to the following examples for detail.

Optionally, the quarter-wave plate is disposed on a position in the optical path of the system at which the beam divergence angle is not large and the beam is approximate to a parallel beam.

When only one quarter-wave plate is disposed in the laser projector, optionally, the wave plate may correspond to a red laser wavelength or a green laser wavelength.

In summary, in various embodiments, by providing a quarter-wave plate before the laser beams of three colors are combined, or by providing the quarter-wave plate on the optical path of the combined beam of the three-color laser light, the originally linearly polarized light is converted into circularly polarized light or elliptically polarized light, so that the difference in transmittance of each primary color light in the projection optical system becomes small, and the difference in reflectivity of the primary color light to be reflected by the projection screen is also reduced, thereby effectively reducing and improving the local color aberration phenomenon present on a projected image.

Further, those skilled in the art should understand that when the display problem of the projected image caused by different polarization directions of the three primary color light is solved according to the discussed embodiments, the red laser light used as P-polarized light and the blue and green laser light used as S-polarized light are exemplified, but the present application is not limited to this combination of P-polarized light and S-polarized light. In the application, those skilled in the art may make adaptive changes according to the color and polarization direction of the actual beam in combination with the core principles of the discussed embodiments, and these changes should also be within the protection scope of the present application.

Figure 11:
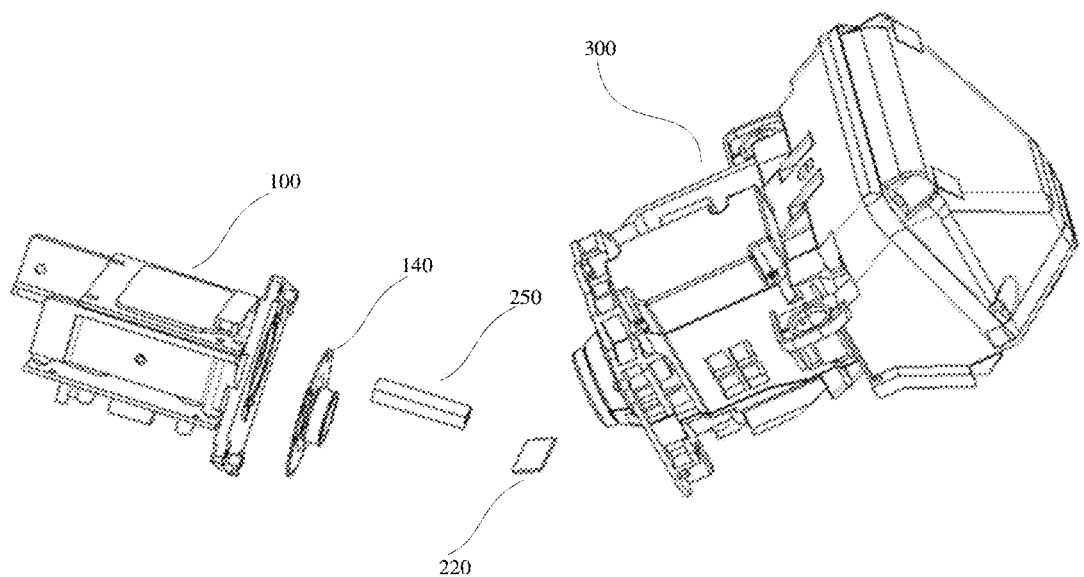
FIG. 11 is an exploded view illustrating a simplified structure shown in FIG. 5A-1 according to one or more embodiments.

FIG. 11 is an exploded view illustrating a simplified structure shown in FIG. 5A-1. As shown in FIG. 11, the laser projector includes a light source unit 100, a lighting system (not shown), and a lens unit 300.

Figure 12A:
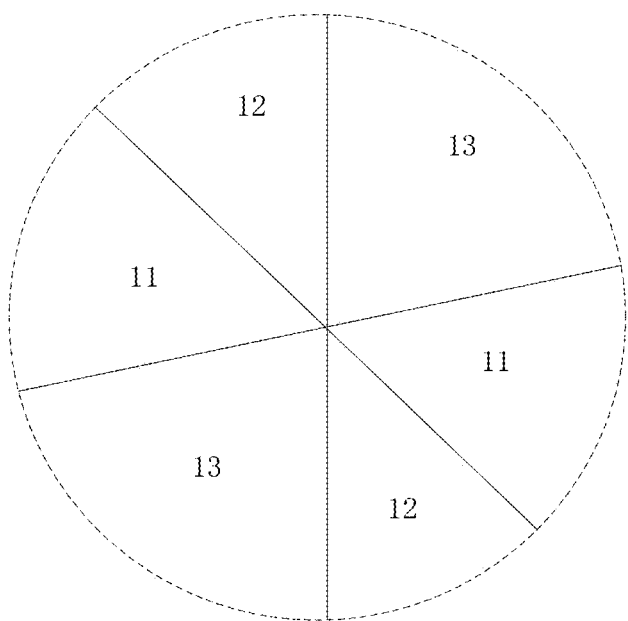
FIG. 12A is a schematic view illustrating a plane structure of a rotary wheel according to one or more embodiments.

Three-color laser beams emitted from the light source unit 100 pass through a diffusion unit 140, which may also be referred to as rotatable wheel 140, and then enters an optical homogenizing component 250 such as a light-pipe. The light-pipe 250 collects and homogenizes a combined beam, and the homogenized beam is incident into the surface of a light valve 220 through other lenses and prisms of the illumination optical path. Thereafter, the light valve 220 reflects the projected beam into projection lens 300 for imaging and ultimately exhibiting the image on the projection screen. Specifically, in some embodiments, the rotatable wheel 140 may include six color segments and three regions in total as shown in FIG. 12A. Each region is periodically located on the path of a laser beam of a certain color. Each region is provided with a quarter-wave plate corresponding to the wavelength of a color laser light. For example, a region 11 is provided with a quarter-wave plate g for transmitting green laser light; a region 12 is provided with a quarter-wave plate b for transmitting blue laser light; and a region 13 is provided with a quarter-wave plate r for transmitting red laser light.

The rotation period of the rotatable wheel 140 may coincide with the output timing of the light source. As the light source unit chronologically outputs three primary color laser beams, the three primary color laser beams are respectively incident into a quarter-wave plate region corresponding to laser light wavelength of different colors on the rotatable wheel 140, and the phase is changed after passing through corresponding quarter-wave plate. Further, since each primary color light passes through the movable wave plate, the degree of phase change of each primary color light becomes different due to a difference in optical distance, so that the polarization directions of the respective primary color light are distributed in a plurality of directions. In this way, the three primary color light will no longer have polarization characteristics, thereby effectively eliminating the local color aberration phenomenon present on a projected image caused by different polarization directions of respective primary color laser light.

Further, as another specific implementation of the structure of the rotatable wheel 140, the rotatable wheel 140 is divided into three regions, each including a light incidence surface I and a light exiting surface O. For example, the light incidence surface I of a light transmitting substrate is provided with a crystal growth layer, and the light exiting surface O thereof is provided with a microstructure, which may be formed by coating on the light-transmitting substrate. Alternatively, the substrate may also be made of a diffuser material, and its light exiting surface O is a light diffusion surface.

The application of the rotatable wheel 140 may not only depolarize the transmitted laser beams with different wavelengths, but also diffuse the laser beams of different colors to achieve the technical effect of dissipating the speckles.

It should be noted that, for the sake of brevity, the rotatable wheel 140 will be described by taking the three regions as an example. In some embodiments, the rotatable wheel 140 is not limited to be divided into three regions. Further, the light source unit 100 may chronologically output not only three primary color light but also other colors light besides the three primary color light. For example, when the red laser light emitting region and the green laser light emitting region are simultaneously illuminated, the light source unit outputs yellow light. In addition to the three primary color light: red, green and blue light, there is also yellow light. The control over the red, green, and blue laser light emitting regions is not limited to chronological output either. For example, the control timing of the red and green laser light emitting regions may have an overlaying period in order to commonly output a beam of corresponding color.

With respect to the structure of a plurality of regions of the rotatable wheel 140, such as more than 3 regions, a phase delaying component similar to that in the above-described technical solution or a diffuser having a phase delaying effect is still used, which makes it possible to delay the phase of the transmitted laser beams of respective colors in many ways, thus a linearly polarized light is depolarized, and the color aberration phenomenon present on a projected image can be effectively eliminated or improved.

Further, the rotatable wheel 140 may be disposed on the optical output path of the beam combination mirror group 120 of the light source unit 100. For example, the three primary color laser light, after being combined by the beam combination mirror group 120, passes through a focusing lens as the beam shaping component 112, for beam contraction and is incident into the rotatable wheel 140. Then, the beam exits from the rotatable wheel 140 first enters the light collecting component or the optical homogenizing component 250 such as the light-pipe, and then enters the illumination optical path of the light valve 220. The rotatable wheel 140 may be placed close to the light incidence surface of the light-pipe.

Further, the rotatable wheel 140 may also be disposed on the light exiting surface of the light-pipe, and the light exiting surface of the light-pipe and the light valve 220 are in a conjugate object-image relationship.

When the above-described structure of the rotatable wheel 140 is disposed at other positions on the optical path of the combined beam of the three primary color laser light, the uneven chromaticity problem present on a projected image may also be solved In some embodiments, a plurality of phase delaying regions provided in the rotatable wheel 140 may not be limited by the beam combination structure of the laser light source and the arrangement position of the phase delaying components. Therefore, the light source unit 100 may have a variety of light source architectures. For example, an MCL three-color package laser or a BANK laser or the like is used as the light source architecture of the laser assembly.

In some embodiments, the rotatable wheel 140 may be provided with a phase delaying plate, or the light incidence surface of the rotatable wheel 140 may be made of a phase delaying plate crystal material, and the light exiting surface thereof may be provided with a diffusion microstructure. As the rotatable wheel 140 rotates, the three primary color laser beams are transmitted through the phase delaying plate in sequence. In a specific implementation, the rotatable wheel 140 may not synchronize with the light output timing of the laser light source as long as it keeps rotating to sequentially transmit the laser beams of three colors. The phase delaying plate on the rotatable wheel 140 may be circular, and the phase delaying plate may be configured to be a half-wave plate or a quarter-wave plate, or wave plates with different thickness. Using the phase difference generated by the phase delaying plate, the wave plates with different thicknesses may delay the phase of laser beams transmitted therethrough, thus a completely polarized light is formed to exit, thereby depolarizing the original three primary color linearly polarized light and further effectively eliminating the local color shift phenomenon present on a projected image.

In some embodiments, in order to improve the definition of a projected image, a vibratable flat plate, i.e., a vibrating mirror may be disposed on the optical path of the light valve 220 to the projection lens. The vibrating mirror may transmit beams. The phase delaying component may also act as a vibrating mirror to change the angle of the laser beams transmitted therethrough through vibration, so that the beams of two projected images successively passing through the vibrating mirror are misaligned, and thereby the contents of the two adjacent projected images are also misaligned and overlaid. The two images may be decomposed from a high-resolution image. In this way, the display of the high-resolution image may also be realized by the low-resolution light valve 220, so that the details of the images perceived by a user are almost identical to the contents of the high-resolution image, and the definition of the projected image is improved perceptually. The phase delaying component may be provided as a quarter-wave plate or a half-wave plate, and may be configured with respect to a wavelength of one of the three colors.

When the rotatable wheel 140 depolarizes the laser beams to solve the local color aberration problem present on a projected image, it is possible to dissipate the speckles and further reduce or simplify the arrangement of individual phase delaying component and speckles dissipating component in the projection system, thereby facilitating reduction in complexity of optical architectures and miniaturization of the laser projector.

In some embodiments, provision of a movable phase delaying component on the optical output path of multi-color laser beams may depolarize the linearly polarized light of different colors whose original polarization directions are perpendicular to each other, so that the consistency of light processing performed by the optical lenses in the optical system and the projection screen on each color light is improved, thereby effectively eliminating the local color aberration phenomenon present on a projected image caused by different polarization directions of multi-color laser beams and further improving the display quality of the projected image.

One or more embodiments of the present application provide a laser projector, which will be described in conjunction with the foregoing FIGS. 5A-1, 5A-2, 5A-3, 5B, 5C, 5D, 5E, 6A-1, 6A-2, 6A-3, 6A-4, 6B, 6C, 7, 8A, 8B, 9A, 9B, 10, 11, 12A and with reference to FIGS. 12B-1, 12B-2, 13A, 13B, 14, 15, 16, and components that are substantially the same as those in the embodiments discussed above will not be described herein again.

FIG. 11 is an exploded, simplified schematic view of FIG. 5A-1. As shown in FIG. 11, a three-color laser light emitted from a light source unit 100 included in a laser projector is incident into a diffusion wheel 140, and the diffusion wheel 140 rotates to diffuse the combined beam of the three-color laser light and outputs the diffused beam to an optical homogenizing component 250 such as a light-pipe. Next, the light-pipe 250 collects and homogenizes the beam, and causes the homogenized beam to enter a surface of a light valve 220 after passing through the illumination optical path as shown in FIG. 2A. Then, the light valve 220 modulates the beam from the illumination optical path in response to a received driving signal, and causes the modulated beam to enter a projection lens 300 and finally form an image on a projection screen.

Specifically, as shown in FIGS. 5A-2 and 12B-1, it is an example embodiment of the light source unit 100 of a laser projector 10. FIG. 5B-2 is a cross-sectional structural view of FIG. 5B-1. The light source unit includes a housing 150 and a laser assembly 110. The light source unit 100 is a three-color laser light source, and laser beams of three colors are emitted from the opening 152 of the light source unit 100.

Figures 1, 12B:
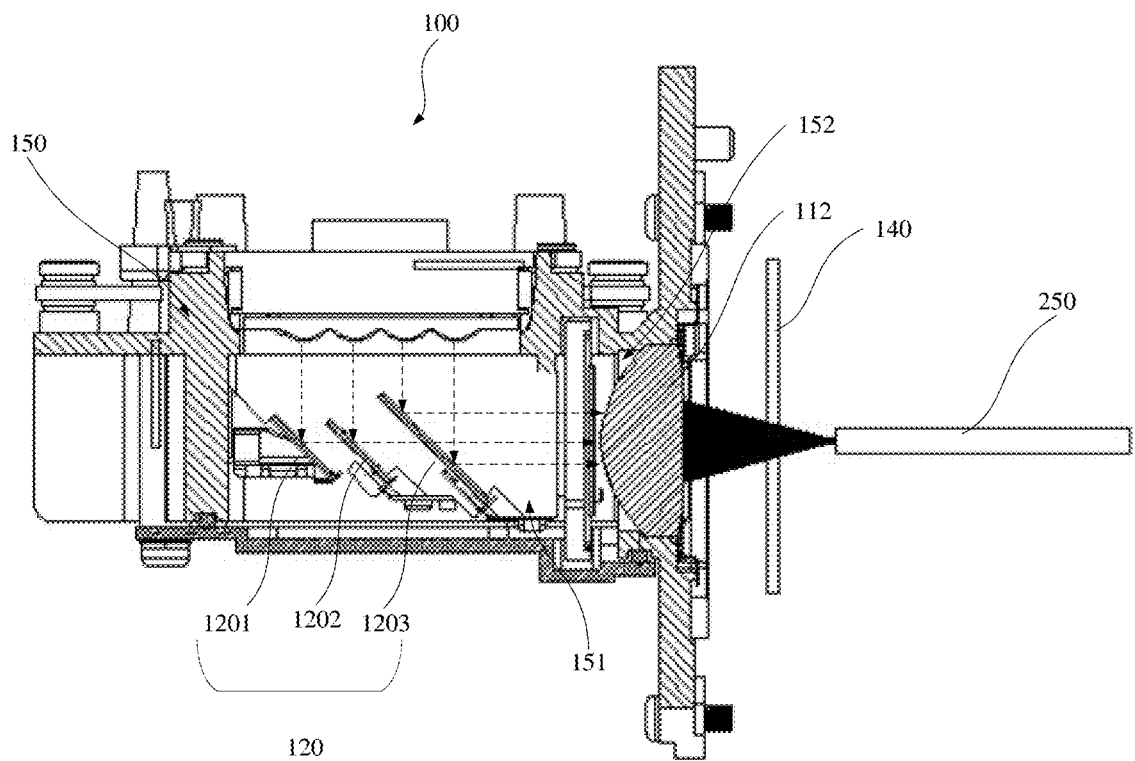
Figures 2, 12B:
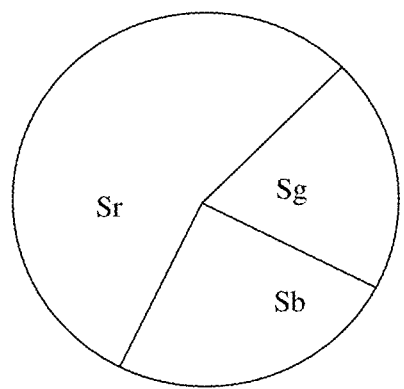

The housing 150 has a receiving cavity 151. The laser assembly 110 and a beam combination mirror group 120 are at least partially housed in the receiving cavity 151. The receiving cavity 151 has an opening 152 along a light exiting direction of the light source. The three-color laser beams are incident into a diffusion wheel 140 along an optical path from the opening 152. Phase delaying plates or phase delaying regions may be disposed on the diffusion wheel 140 as shown in FIG. 12B-1.

The beams of three-color laser having different polarization directions are incident into the diffusion wheel 140. Specifically, a phase delaying plate may be disposed on the diffusion wheel 140. Specifically, FIG. 12B-2 is a schematic view illustrating a plane structure of the diffusion wheel. According to the incident timing of the three primary color laser beams, the surface of the diffusion wheel 140 may have three color segment partitions, which are respectively Sr, Sg, and Sb. In an implementation, the three partitions are each provided with a phase delaying plate, or a whole phase delaying plate is provided and divided into three color segment partitions to respectively transmit laser beams of three colors according to timing.

The phase delaying plate corresponds to a wavelength of a certain color, which affects the degree of change in phase of a transmitted beam by the thickness of grown crystal. In some embodiments, the phase delaying plate is a half-wave plate, also called λ½ wave plate, which may change the phase of beam of a corresponding wavelength of a color transmitted through the wave plate by π, that is, 180 degrees, and rotate the polarization direction thereof by 90 degrees, for example, P-polarized light is converted into S-polarized light or the S-polarized light is converted into the P-polarized light. When the phase delaying plate is a quarter-wave plate or a three-quarter wave plate, the beam with the corresponding color wavelength transmitted through the wave plate may be converted from linearly polarized light into circularly polarized light. A schematic representation of the circularly polarized light is shown in FIG. 6B.

As shown in FIG. 6A-1, the phase delaying plate or the wave plate is formed through the growth of crystal. The crystal has its own optical axis W, and the optical axis W is located in the plane of the wave plate. Thus, when the wave plate is disposed on the optical path as shown in FIG. 6A-1, the optical axis W of the wave plate and the optical axis O of the light source are perpendicular to each other.

Figure 13A:
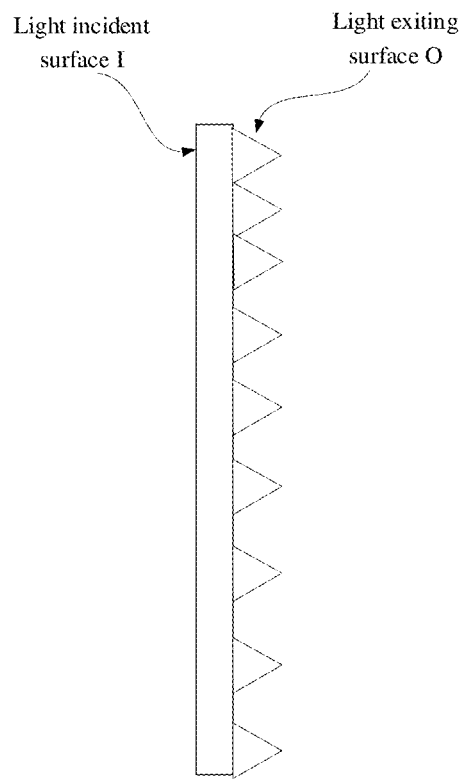
FIGS. 13A and 13B are schematic views illustrating a cross-sectional structure of the diffusion wheel according to one or more embodiments.
Figure 13B:
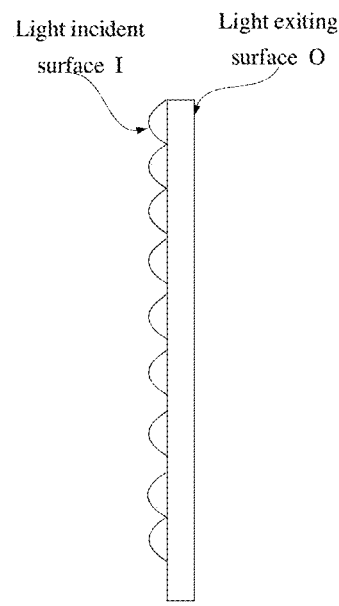

In an implementation, as shown in FIG. 13A, the light incidence surface I of the diffusion wheel 140 is provided with a phase delaying plate, and the light exiting surface O thereof is provided with a diffusion microstructure. Alternatively, as shown in FIG. 13B, the light incidence surface I of the diffusion wheel 140 is provided with a diffusion microstructure, and the light exiting surface O thereof is provided with a phase delaying plate. For example, a light transmitting substrate is provided with a crystal growth layer on one surface and a microstructure on the other surface. The microstructure may be formed by coating on the light transmitting substrate, or the substrate may also be made of a diffuser material. A side away from the wave plate is a light diffusion surface.

There may be a variety of choices for the thickness of the phase delaying plate, and optionally, it may be a quarter-wave plate or a half-wave plate or a three-quarter wave plate.

Further, a wavelength of a wave plate may be the wavelength of any of the three primary color light.

With respect to the process and principle of the movable phase delaying plate for phase change, reference may be made to the description of example as shown in FIG. 6B, and the details thereof are not described herein again. In some embodiments, since the diffusion wheel 140 performs a rotatable movement, the phase delaying plate also follows the rotatable movement, so that the phase change of the linearly polarized light after passing through the movable phase delaying plate becomes random, and the change of its polarization direction is also random and multidirectional. In other words, the movable phase delaying plate depolarizes the linearly polarized light, so that the consistency of light processing performed by the optical lens in the optical system and the projection screen on each color light is improved, thereby effectively eliminating the local color aberration phenomenon present on a projected image caused by different polarization directions of multi-color laser beams and further improving the display quality of the projected image.

Further, application of the diffusion wheel with the above-described structure may not only depolarize the transmitted laser beams with different wavelengths, but also diffuse the laser beams of different colors so as to achieve the technical effect of dissipating the speckles.

As shown in FIG. 12B-2, each region is provided with a quarter-wave plate for particular color laser light, where region Sg is provided with a quarter-wave plate g for transmitting green laser light, region Sb is provided with a quarter-wave plate b for transmitting blue laser light, and region Sr is provided with a quarter-wave plate r for transmitting red laser light.

In some embodiments, the phase delaying plate may be provided only on the rotatable wheel, and the diffusion microstructure is not provided, so that the structural arrangement on the rotatable wheel may be simplified. At this time, one or more phase delaying plates may be placed on the rotatable wheel. As the wheel rotates, the three-color laser beams are sequentially transmitted through the phase delaying plate on the rotatable wheel, and the polarization directions of the transmitted laser beams are converted multidirectionally. In a specific implementation, the rotatable wheel may not be limited to synchronize with the light output timing of the laser light source, as long as it keeps rotating to transmit the laser beams of three colors sequentially. The phase delaying plate on the rotatable wheel may be circular. The phase delaying plate may be configured to be a half-wave plate or a quarter-wave plate or wave plates with different thickness. Depending on the movement form of the phase delaying plate, the wave plates with different thicknesses may delay the phase of the laser beams transmitted therethrough, thus a completely polarized light is formed to emit, thereby depolarizing the original three-color linearly polarized light and further eliminating the local color aberration phenomenon present on a projected image.

Figure 14:
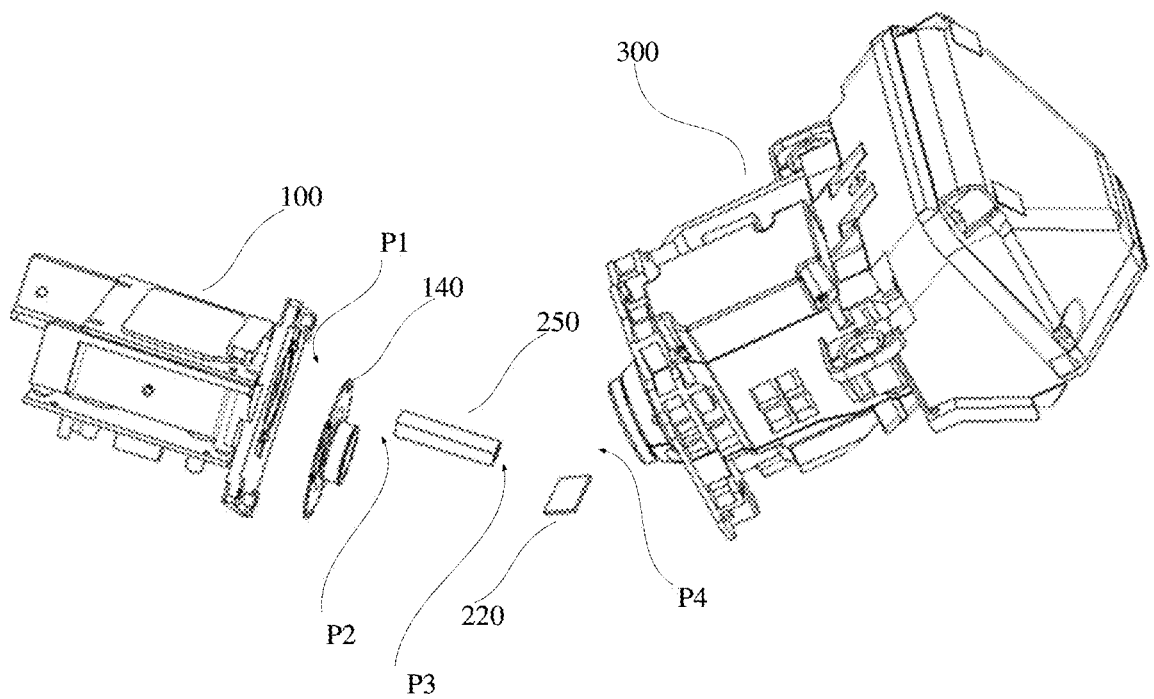
FIG. 14 is another schematic view illustrating a structure of a laser projector according to one or more embodiments.

FIG. 14 is another schematic view illustrating a structure of a laser projector according to one or more embodiments. As shown in FIG. 14, a movable phase delaying component is disposed on an optical output path of a light source unit, and the phase delaying component may be disposed at a plurality of positions on the optical path instead of on the diffusion wheel 140.

In an implementation, as shown in FIG. 14, the movable phase delaying component may be disposed at position P1 in the combined light output path of the light source unit 100 and in front of the diffusion wheel 140. Optionally, the movable phase delaying component is disposed between a beam shaping component and the diffusion wheel 140. In this way, the phase delaying component may receive a contracted beam, and the size of the phase delaying component may be smaller, thereby lowering cost and reducing the volume of the fixed structure and the driving structure. Moreover, depolarization is achieved before multi-color linearly polarized light in different polarization directions enters other optical lenses of the projection optical system, which contributes to reducing light loss in the system.

In another implementation, as shown in FIG. 14, the movable phase delaying component may be disposed on the optical path that is incident into a light-pipe 250 after diffused by the diffusion wheel 140, for example, at position P2 as shown in the figure. Optionally, the movable phase delaying component may be disposed at the light entrance to the light-pipe 250. Because the light spot at this position has a small size.

Further, in another implementation, as shown in FIG. 14, the movable phase delaying component may be disposed at the light exit of the light-pipe 250, for example, at position P3 as shown in the figure. After the multi-color laser beams are homogenized by the light-pipe 250, the energy distribution of the beams is already fairly uniform, which is more favorable for the movable phase delaying component to convert the polarization direction of the combined beam multidirectionally, and the degree of change in polarization direction of each color light is also relatively consistent. A light exit of the light-pipe 250 and the light entrance of the light valve, such as the DMD chip 220 are in an object-image relationship.

The moving mode of the phase delaying component, in some embodiments, may include rotation, vibration, or other one- or two-dimensional movement.

The phase delaying component, in some embodiments, may be a half-wave plate or a quarter-wave plate or a three-quarter wave plate corresponding to a color wavelength of any one of the three-color laser beams, or wave plates of other thickness.

Further, in another implementation, a vibratable phase delaying component may be provided at position P4 as shown in FIG. 14, that is, a vibratable phase delaying component may be disposed on the optical path from the light valve such as the DMD chip 220 to the projection lens 300. The vibratable phase delaying component may be of a flat plate light transmitting structure. Thus, in an aspect, with the vibratable phase delaying component, the polarization direction of the original P-polarized light or S-polarized light may be made multidirectionally, so that the depolarization may be realized to solve the local color aberration problem present on a projected image.

Meanwhile, the phase delaying component receives the projection beam reflected from the light valve 220, and the vibratable state of the phase delaying component causes the beams of two projected images successively passing through the phase delaying component to be misaligned, so that the contents of the two adjacent projected images are also overlaid in a staggered way. The two images may be decomposed from a high-resolution image. In this way, the display of the high-resolution image may also be realized by a low-resolution light valve, so that the details of the images perceived by a user are almost identical to the contents of the high-resolution image, and the definition of the projected image is improved perceptually.

Figure 15:
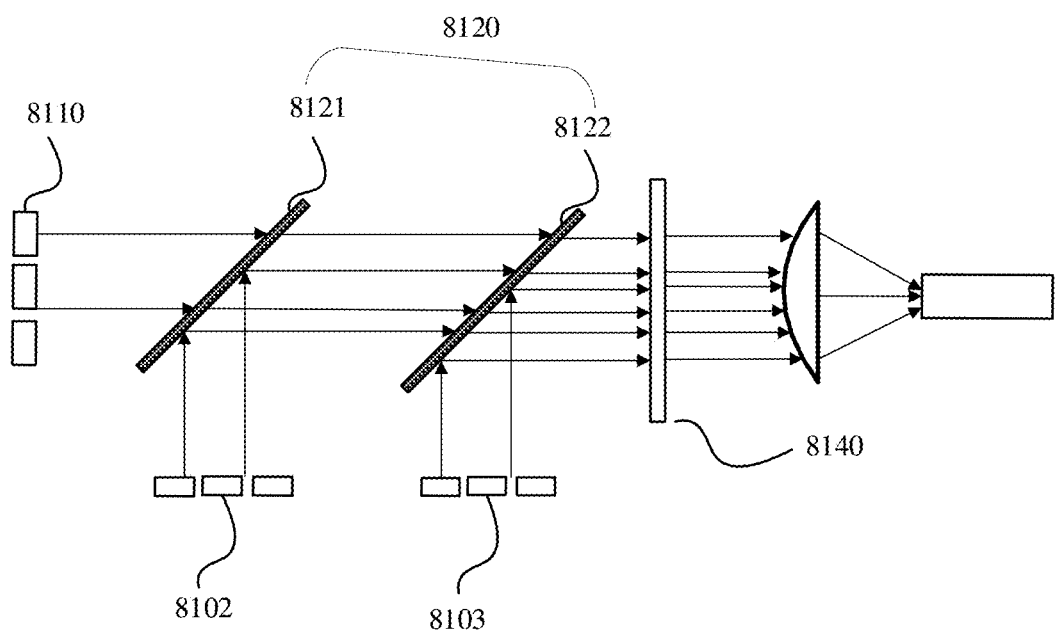
FIG. 15 is a schematic view illustrating an optical path of a laser projector according to one or more embodiments.

FIG. 15 is a schematic view illustrating an optical path of a laser projector according to one or more embodiments. For the laser projector with the optical path shown in FIG. 15, its light source unit includes at least three sets of laser assemblies, each of which emits a laser beam different from the other two ones.

A laser assembly 8110 emits a first color light, a laser assembly 8102 emits a second color light, and a laser assembly 8103 emits a third color light.

The light of the three sets of laser assemblies is combined by a beam combination mirror group 8120. Referring to FIG. 15, the beam combination mirror group 8120 includes a fourth beam combination mirror 8121 and a fifth beam combination mirror 8122. The fourth beam combination mirror 8121 and the fifth beam combination mirror 8122 may be both dichroic filters.

The fourth beam combination mirror 8121 transmits the first color laser light and reflects the second color laser light to the fifth beam combination mirror 8122. The fifth beam combination mirror 8122 transmits the first and second color laser light and reflects the third color laser light. Thus, laser light of the first, second and third color is combined to output via the fifth combining mirror 8122.

In a specific implementation, the first color is red, the second color is green, and the third color is blue. Thereby, the fourth beam combination mirror 8121 transmits red light and reflects green light, and the fifth beam combination mirror 8122 transmits the red and green light and reflects blue light.

After the beam combination by the beam combination mirror group consisting of the fourth beam combination mirror 8121 and the fifth beam combination mirror 8122, the three-color laser beams having different polarization directions also pass through a diffusion wheel 8140, and the diffusion wheel 8140 may adopt the same diffusion wheel structure as the diffusion wheel 140 described above, so that the multi-color linearly polarized light with different polarization directions may be depolarized using the rotatable phase delaying plate to solve the local color aberration problem present on a projected image, the process and principle of which are not described herein again.

In some embodiments, the diffusion wheel 8140 is still made of a diffuser material and has only a diffusion effect. Application of the movable phase delaying component disposed at a plurality of positions on the optical path of the laser projector may also achieve the purpose of depolarizing the multi-color linearly polarized laser beams in different polarization directions, thereby solving the local color aberration problem present on a projected image.

Figure 16:
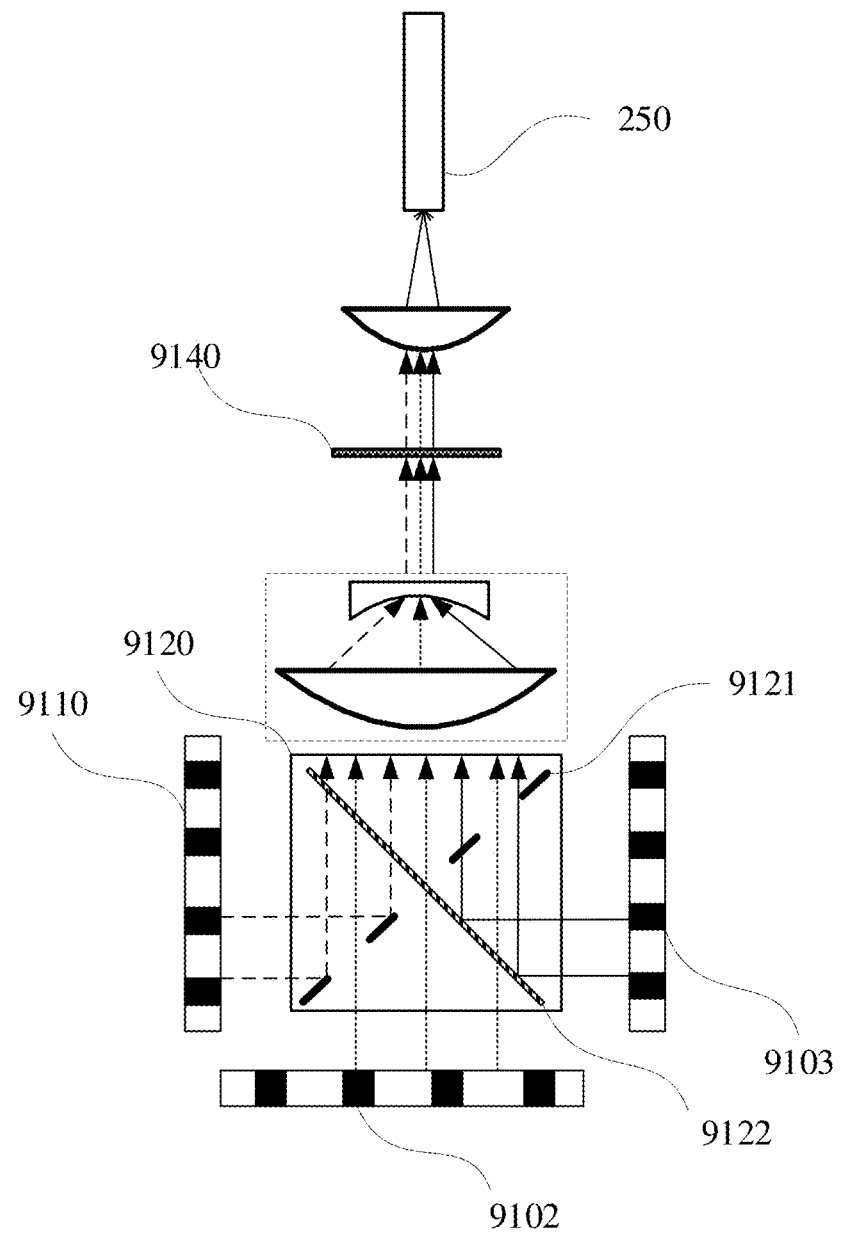
FIG. 16 is another schematic view illustrating an optical path of a laser projector according to one or more embodiments.

FIG. 16 is another schematic view illustrating an optical path of a laser projector according to one or more embodiments. The substantially same components, connection relationship, working principles, and the like with the above-discussed embodiments will not be described again. For the laser projector with optical path shown in FIG. 16, a green laser light emitted by a laser assembly 9110 is incident into a sixth beam combination mirror 9121 and is reflected by the sixth beam combination mirror 9121 to the seventh beam combination mirror 9122. A blue laser light emitted by a laser assembly 9102 is sequentially transmitted through the sixth beam combination mirror 9121 and the seventh beam combination mirror 9122. A red laser light emitted by laser assembly 9103 is reflected by the seventh beam combination mirror 9122 to the sixth beam combination mirror 9121 and is transmitted by the sixth beam combination mirror 9121. Finally, the three-color laser light is combined by a beam combination mirror group 9120 including the sixth beam combination mirror 9121 and the seventh beam combination mirror 9122. After combining the beams by an X beam combination mirror group, the three-color laser beams having different polarization directions also pass through a diffusion wheel 9140. The diffusion wheel 9140 may adopt the diffusion wheel structure as the diffusion wheel 140 described above, so that the multi-color linearly polarized light with different polarization directions may be depolarized using the rotatable phase delaying plate so as to solve the local color aberration problem present on a projected image, the process and principle of which are not described herein again.

In some embodiments, the diffusion wheel 9140 is still made of a diffuser material and has a diffusion effect merely. While the movable phase delaying component disposed at a plurality of positions is applied on the optical path of the laser projector, which may also achieve the purpose of depolarizing the multi-color linearly polarized laser beams in different polarization directions, thereby solving the local color aberration problem present on a projected image.

In some embodiments, provision of a movable phase delaying component on the optical output path of multi-color laser beams may depolarize the linearly polarized light of different colors whose original polarization directions are perpendicular to each other, so that the consistency of light processing performed by the optical lens in the optical system and the projection screen on each color light is improved, thereby effectively eliminating the local color aberration phenomenon present on a projected image caused by different polarization directions of multi-color laser beams and further improving the display quality of the projected image.

Finally, it should be noted that the discussed example embodiments are used only to explain, but are not intended to limit the technical solutions of the present application. Although the present application is described in detail with reference to the foregoing examples, those skilled in the art should understand that the technical solutions described in the foregoing examples may be modified, or part or all of the technical features therein may be equivalently replaced. These modifications or replacements do not deviate the essence of corresponding technical solutions from the scope of technical solutions of the present application.

The invention claimed is:

1. A laser projector, comprising:
   a laser assembly comprising a red laser light emitting region configured to output a red laser light, a blue laser light emitting region configured to output a blue laser light, and a green laser light emitting region configured to output a green laser light, wherein the red laser light is polarized in a first direction, the green laser light is polarized in a second direction, the blue laser light is polarized in a third direction, and the first direction is different from at least one of the second direction or the third direction;
   a beam combination mirror group configured to combine the red laser light, the blue laser light and the green laser light emitted by the laser assembly; and
   a phase delaying component, on a light emitting path of at least one of the red laser light, the blue laser light or the green laser light, and configured to change a polarization direction of the at least one of the red laser light, the blue laser light or the green laser light before the red laser light, the green laser light, and the blue laser light are output by the beam combination mirror group;
   wherein
   the phase delaying component is on the light emitting path of the green laser light emitting region and the blue laser light emitting region,
   the second direction is equal to the third direction, and a polarized direction of each of the green laser light and the blue laser light after being transmitted through the phase delaying component is changed by 90 degrees.

2. The laser projector according to claim 1, wherein the phase delaying component is on the light emitting path of the red laser light emitting region, and
   the first direction of the red laser light after being transmitted through the phase delaying component is changed by 90 degrees.

3. The laser projector according to claim 2, wherein the laser assembly comprises a laser package assembly including an array of light emitting chips, and the array of light emitting chips comprises:
   a first light emitting chip configured to emit the red laser light from the red laser light emitting region;
   a second light emitting chip configured to emit the blue laser light from the blue laser light emitting region; and
   a third light emitting chip configured to emit the green laser light from the green laser light emitting region.

4. The laser projector according to claim 3, wherein the beam combination mirror group comprises:
   a first beam combination mirror corresponding to the green laser light emitting region,
   a second beam combination mirror corresponding to the blue laser light emitting region, and
   a third beam combination mirror corresponding to the red laser light emitting region, wherein
   the first beam combination mirror is configured to reflect the green laser light to the second beam combination mirror,
   the second beam combination mirror is configured to transmit the green laser light and reflect the blue laser light to the third beam combination mirror, and
   the third beam combination mirror is configured to transmit the blue laser light and the green laser light and reflect the red laser light to a beam shaping component.

5. The laser projector according to claim 4, wherein the phase delaying component is located on an optical path of the red laser light incident into the third beam combination mirror.

6. The laser projector according to claim 4, wherein the phase delaying component is located on an optical path of the green laser light incident into the first beam combination mirror and the blue laser light incident into the second beam combination mirror.

7. The laser projector according to claim 4, wherein the phase delaying component is located between the second beam combination mirror and the third beam combination mirror.

8. The laser projector according to claim 1, wherein the phase delaying component comprises a phase delaying plate located on a combined optical path of the blue laser light and the green laser light.

9. The laser projector according to claim 1, wherein the phase delaying component comprises a phase delaying plate having a first phase delaying region on the light emitting path of the blue laser light output from the blue laser light emitting region and a second phase delaying region on the light emitting path of the green laser light output from the green laser light emitting region, the blue laser light emitting region and the green laser light emitting region being adjacent to each other.

10. The laser projector according to claim 1, wherein the phase delaying component comprises a first phase delaying plate on the light emitting path of the blue laser light and a second phase delaying plate on the light emitting path of the green laser light.

11. The laser projector according to claim 1, wherein the phase delaying component comprises a first phase delaying region on the light emitting path of the blue laser light and a second phase delaying region on the light emitting path of the green laser light.

12. The laser projector according to any of claim 1, wherein the phase delaying component is a half-wave plate.

13. A laser projector, comprising:
a laser assembly configured to emit red laser light, blue laser light, and green laser light, wherein the red laser light is polarized in a first direction, the green laser light is polarized in a second direction, the blue laser light is polarized in a third direction, and the first direction is different from at least one of the second direction or the third direction;
a beam combination mirror group on an optical output path of the red laser light, the blue laser light and the green laser light, the beam combination mirror group being configured to combine the red laser light, the blue laser light, and the green laser light to generate a combined beam;
a beam shaping component configured to receive and contract the combined beam emitted by the beam combination mirror group;
a diffusion wheel configured to rotate and diffuse the combined beam contracted by the beam shaping component;
an optical homogenizing component configured to homogenize the combined beam diffused by the diffusion wheel;
a light valve configured to receive a driving signal, modulate the combined beam homogenized by the optical homogenizing component, and output the modulated combined beam to a projection lens; and
a phase delaying component on an optical path before the modulated combined beam is output to the projection lens, and configured to change a polarization direction of at least one of the red laser light, the green laser light and the blue laser light.

14. The laser projector according to claim 13, wherein the phase delaying component is on a combined optical output path of the blue laser light and the green laser light.

15. The laser projector according to claim 13, wherein the phase delaying component is disposed on an optical output path of each of the blue laser light and the green laser light and before the combined beam of the red laser light, the blue laser light and the green laser light is generated.

16. The laser projector according to claim 13, wherein the phase delaying component is on an optical output path of the red laser light and before the combined beam of the red laser light, the blue laser light and the green laser light is generated.

17. The laser projector according to any of claim 16, wherein the phase delaying component is a half-wave plate.

18. The laser projector according to claim 13, wherein the phase delaying component is on each of an optical output path of the red laser light, an optical output path of the blue laser light and an optical output path of the green laser light, and
the red laser light, the blue laser light and the green laser light are output to the beam combination mirror group after passing through the phase delaying component.

19. The laser projector according to claim 13, wherein the phase delaying component is a movable phase delaying plate comprising one or more of a rotatable phase delaying plate or a vibratable phase delaying plate.

* * * * *